(12) United States Patent
Coakley et al.

(10) Patent No.: US 12,035,459 B2
(45) Date of Patent: Jul. 9, 2024

(54) METHODS OF FORMING FLEXIBLE INTERCONNECT CIRCUITS

(71) Applicant: CelLink Corporation, San Carlos, CA (US)

(72) Inventors: Kevin Michael Coakley, Belmont, CA (US); Malcolm Parker Brown, Mountain View, CA (US); Dongao Yang, Redwood City, CA (US); Michael Lawrence Miller, San Mateo, CA (US); Paul Henry Lego, Woodside, CA (US)

(73) Assignee: CelLink Corporation, San Carlos, CA (US)

( * ) Notice: Subject to any disclaimer, the term of this patent is extended or adjusted under 35 U.S.C. 154(b) by 0 days.

(21) Appl. No.: 18/521,587

(22) Filed: Nov. 28, 2023

(65) Prior Publication Data

US 2024/0098873 A1    Mar. 21, 2024

Related U.S. Application Data

(60) Division of application No. 17/383,129, filed on Jul. 22, 2021, which is a continuation of application No.
(Continued)

(51) Int. Cl.
*H05K 3/00* (2006.01)
*H01M 50/519* (2021.01)
(Continued)

(52) U.S. Cl.
CPC ........ *H05K 1/0201* (2013.01); *H01M 50/519* (2021.01); *H05K 1/118* (2013.01);
(Continued)

(58) Field of Classification Search
CPC ............ H05K 3/06; H05K 3/20; H05K 3/281; H05K 2203/066; H05K 3/0073;
(Continued)

(56) References Cited

U.S. PATENT DOCUMENTS 2,774,173 A    12/1956    Heinz
3,750,278 A    8/1973    Oberg et al.
(Continued)

FOREIGN PATENT DOCUMENTS

CN    102113130 A    6/2011
CN    102132423 A    7/2011
(Continued)

OTHER PUBLICATIONS

Shimoto et al, "New high-density multilayer technology on PCB," in IEEE Transactions on Advanced Packaging, vol. 22, No. 2, pp. 116-122, May 1999. (Year: 1999).*
(Continued)

*Primary Examiner* — A. Dexter Tugbang
(74) *Attorney, Agent, or Firm* — Polygon IP, LLP

(57) ABSTRACT

A method of forming a flexible interconnect circuit is described. The method may comprise laminating a substrate to a conductive layer and patterning the conductive layer using a laser while the conductive layer remains laminated to the substrate thereby forming a first conductive portion and a second conductive portion of the conductive layer. The substrate maintains the orientation of the first conductive portion relative to the second conductive portion during and after patterning. The method may also comprise laminating a first insulator to the conductive layer and removing the substrate from the conductive layer such that the first insulator maintains the orientation of the first conductive portion relative to the second conductive portion while and after the substrate is removed. The method may also com-
(Continued)

prise laminating a second insulator to the second side of the conductive layer while the first insulator remains laminated to the substrate.

24 Claims, 12 Drawing Sheets

Related U.S. Application Data

16/034,899, filed on Jul. 13, 2018, now Pat. No. 11,116,070.

(60) Provisional application No. 62/531,995, filed on Jul. 13, 2017.

(51) Int. Cl.
| | | |
|---|---|---|
| *H05K 1/02* | (2006.01) | |
| *H05K 1/11* | (2006.01) | |
| *H05K 3/06* | (2006.01) | |
| *H05K 3/20* | (2006.01) | |
| *H05K 3/28* | (2006.01) | |
| *H05K 3/46* | (2006.01) | |

(52) U.S. Cl.
CPC ............ *H05K 3/007* (2013.01); *H05K 3/0073* (2013.01); *H05K 3/06* (2013.01); *H05K 3/20* (2013.01); *H05K 3/281* (2013.01); *H05K 3/4623* (2013.01); *H05K 3/064* (2013.01); *H05K 2201/0145* (2013.01); *H05K 2201/015* (2013.01); *H05K 2201/0154* (2013.01); *H05K 2201/10037* (2013.01); *H05K 2203/066* (2013.01); *Y02E 60/10* (2013.01); *Y10T 29/49156* (2015.01)

(58) Field of Classification Search
CPC .... H05K 3/4623; H05K 3/007; H05K 1/0201; H05K 1/118; H05K 2201/0145; H05K 2201/015; H05K 2201/0154; H05K 2201/10037; H05K 3/064; Y02E 60/70; Y10T 29/49156; H01M 50/519
See application file for complete search history.

(56) References Cited

U.S. PATENT DOCUMENTS

| | | | |
|---|---|---|---|
| 3,903,427 A | | 9/1975 | Pack |
| 3,903,428 A | | 9/1975 | Dejong |
| 3,955,068 A | * | 5/1976 | Shaheen .................. H05K 3/06 |
| | | | 219/549 |
| 4,234,352 A | | 11/1980 | Swanson |
| 4,691,078 A | * | 9/1987 | Nishioka ........... Y10T 29/49156 |
| | | | 174/257 |
| 4,818,840 A | | 4/1989 | Booth et al. |
| 4,927,770 A | | 5/1990 | Swanson |
| 5,053,083 A | | 10/1991 | Sinton |
| 5,262,594 A | | 11/1993 | Edwin et al. |
| 5,645,932 A | | 7/1997 | Uchibori |
| 6,010,771 A | | 1/2000 | Isen et al. |
| 6,036,809 A | | 3/2000 | Kelly et al. |
| 6,143,116 A | * | 11/2000 | Hayashi .................. H05K 3/20 |
| | | | 29/830 |
| 6,160,215 A | | 12/2000 | Curtin |
| 6,210,637 B1 | | 4/2001 | Uno et al. |
| 6,332,909 B1 | | 12/2001 | Teshima et al. |
| 6,500,731 B1 | | 12/2002 | Nakagawa et al. |
| 6,787,732 B1 | | 9/2004 | Xuan et al. |
| 6,881,923 B2 | | 4/2005 | Battaglia |
| 6,992,001 B1 | | 1/2006 | Lin |
| 7,276,724 B2 | | 10/2007 | Sheats et al. |
| 7,497,004 B2 | | 3/2009 | Cote et al. |
| 7,633,035 B2 | | 12/2009 | Kirmeier |
| 8,510,934 B2 | | 8/2013 | Brand et al. |
| 8,931,166 B2 | | 1/2015 | Marttila |
| 8,975,510 B2 | | 3/2015 | Coakley |
| 9,147,875 B1 | | 9/2015 | Coakley et al. |
| 9,214,607 B1 | | 12/2015 | Andrews |
| 9,466,777 B2 | | 10/2016 | Coakley et al. |
| 9,671,352 B2 | | 6/2017 | Woo et al. |
| 9,692,030 B2 | | 6/2017 | Schüssler et al. |
| 9,730,333 B2 | | 8/2017 | Li et al. |
| 10,008,403 B2 | | 6/2018 | Rumsby |
| 10,153,570 B2 | | 12/2018 | Coakley et al. |
| 10,211,443 B2 | | 2/2019 | Coakley et al. |
| 10,383,207 B2 | | 8/2019 | Coakley |
| 10,694,618 B2 | | 6/2020 | Coakley et al. |
| 10,842,025 B1 | | 11/2020 | Lane |
| 11,108,175 B2 | | 8/2021 | Coakley et al. |
| 11,116,070 B2 | | 9/2021 | Coakley et al. |
| 11,545,773 B2 | | 1/2023 | Coakley et al. |
| 11,751,328 B1 | | 9/2023 | Ortiz et al. |
| 11,791,577 B2 | | 10/2023 | Coakley et al. |
| 2001/0006766 A1 | | 7/2001 | O'brien et al. |
| 2002/0046856 A1 | | 4/2002 | Alcoe |
| 2002/0050489 A1 | | 5/2002 | Ikegami et al. |
| 2003/0062347 A1 | | 4/2003 | Song et al. |
| 2004/0144420 A1 | | 7/2004 | Takeyama et al. |
| 2005/0006752 A1 | | 1/2005 | Ogawa |
| 2005/0205524 A1 | * | 9/2005 | Lee .......................... H05K 3/06 |
| | | | 216/91 |
| 2006/0032665 A1 | | 2/2006 | Ice |
| 2007/0034401 A1 | | 2/2007 | Shim |
| 2007/0062573 A1 | | 3/2007 | Ferri et al. |
| 2007/0171129 A1 | | 7/2007 | Coleman et al. |
| 2007/0193027 A1 | | 8/2007 | Takakusaki et al. |
| 2007/0212883 A1 | | 9/2007 | Kano et al. |
| 2008/0017971 A1 | | 1/2008 | Hollis |
| 2008/0083715 A1 | | 4/2008 | Kirmeier |
| 2008/0128397 A1 | | 6/2008 | Gandhi |
| 2008/0216887 A1 | | 9/2008 | Hacke et al. |
| 2009/0007421 A1 | | 1/2009 | Chen et al. |
| 2009/0134939 A1 | | 5/2009 | Feng et al. |
| 2009/0256254 A1 | | 10/2009 | Burdick, Jr. et al. |
| 2009/0301543 A1 | | 12/2009 | Reddy et al. |
| 2009/0314346 A1 | | 12/2009 | Hishida |
| 2010/0012172 A1 | | 1/2010 | Meakin et al. |
| 2010/0024881 A1 | | 2/2010 | Hacke et al. |
| 2010/0031996 A1 | | 2/2010 | Basol |
| 2010/0051085 A1 | | 3/2010 | Weidman et al. |
| 2010/0122842 A1 | | 5/2010 | Kim et al. |
| 2010/0139746 A1 | | 6/2010 | Maydell et al. |
| 2010/0186804 A1 | | 7/2010 | Cornfeld |
| 2010/0300528 A1 | | 12/2010 | Fujii |
| 2011/0000629 A1 | | 1/2011 | Friedrick et al. |
| 2011/0001670 A1 | | 1/2011 | Coleman et al. |
| 2011/0017278 A1 | | 1/2011 | Kalkanoglu et al. |
| 2011/0048536 A1 | | 3/2011 | Rivard et al. |
| 2011/0061724 A1 | | 3/2011 | Houle et al. |
| 2011/0061735 A1 | | 3/2011 | Nishijima |
| 2011/0067751 A1 | | 3/2011 | Meakin et al. |
| 2011/0089212 A1 | | 4/2011 | Schmid et al. |
| 2011/0139210 A1 | | 6/2011 | Hong et al. |
| 2011/0180313 A1 | | 7/2011 | Kamakura |
| 2012/0000511 A1 | | 1/2012 | Gee et al. |
| 2012/0103388 A1 | | 5/2012 | Meakin et al. |
| 2012/0164490 A1 | | 6/2012 | Itoi et al. |
| 2012/0171527 A1 | | 7/2012 | Hiroma |
| 2012/0208411 A1 | | 8/2012 | Krokoszinski et al. |
| 2012/0227907 A1 | | 9/2012 | Arakawa et al. |
| 2012/0285501 A1 | | 11/2012 | Zhao et al. |
| 2013/0055555 A1 | | 3/2013 | Forster et al. |
| 2013/0063738 A1 | | 3/2013 | Lewis et al. |
| 2013/0066884 A1 | | 3/2013 | Kast et al. |
| 2013/0112233 A1 | | 5/2013 | Coakley |
| 2013/0260191 A1 | | 10/2013 | Takahashi et al. |
| 2014/0268780 A1 | | 9/2014 | Wang et al. |
| 2015/0023584 A1 | | 1/2015 | Rudin et al. |
| 2015/0108084 A1 | | 4/2015 | Johnston |
| 2015/0201489 A1 | | 7/2015 | Foong et al. |
| 2015/0228956 A1 | | 8/2015 | Schüssler et al. |
| 2015/0270190 A1 | | 9/2015 | Kim et al. |

(56) References Cited

U.S. PATENT DOCUMENTS

| | | |
|---|---|---|
| 2016/0181579 A1 | 6/2016 | Geshi et al. |
| 2016/0207287 A1 | 7/2016 | Kim |
| 2016/0315304 A1 | 10/2016 | Biskup |
| 2016/0366768 A1 | 12/2016 | Matsuda et al. |
| 2017/0012331 A1 | 1/2017 | Ng et al. |
| 2017/0214033 A1 | 7/2017 | Takano et al. |
| 2018/0034023 A1 | 2/2018 | Newman et al. |
| 2018/0205048 A1 | 7/2018 | Enomoto et al. |
| 2018/0294536 A1 | 10/2018 | Kruszelnicki |
| 2019/0097204 A1 | 3/2019 | Liposky et al. |
| 2019/0181419 A1 | 6/2019 | Suba et al. |
| 2019/0296281 A1 | 9/2019 | Elsberry |
| 2019/0312251 A1 | 10/2019 | Matthews |
| 2019/0341585 A1 | 11/2019 | Shi et al. |
| 2020/0220120 A1 | 7/2020 | Day et al. |
| 2021/0066683 A1 | 3/2021 | Lane |
| 2021/0086306 A1 | 3/2021 | Lane |
| 2021/0091363 A1 | 3/2021 | Lane |
| 2021/0092853 A1 | 3/2021 | Lane |
| 2021/0092854 A1 | 4/2021 | Lane |
| 2021/0092837 A1 | 6/2021 | Lane |
| 2021/0092851 A1 | 6/2021 | Lane |
| 2022/0109256 A1 | 4/2022 | Coakley et al. |
| 2022/0311103 A1 | 9/2022 | Findlay et al. |

FOREIGN PATENT DOCUMENTS

| | | | |
|---|---|---|---|
| CN | 102473794 A | | 5/2012 |
| CN | 203715762 U | | 7/2014 |
| CN | 103988283 A | | 8/2014 |
| CN | 111096089 A | | 5/2020 |
| CN | 111096089 B | | 11/2023 |
| DE | 19809193 A1 | | 9/1999 |
| EP | 2774173 A1 | | 9/2014 |
| EP | 3496180 A1 | | 6/2019 |
| EP | 3653027 A1 | | 5/2020 |
| GB | 2047971 A | | 12/1980 |
| JP | 2010040570 A | | 2/2010 |
| JP | 2011091113 A | | 5/2011 |
| JP | 2014003189 A | * | 1/2014 |
| KR | 20110008284 A | | 1/2011 |
| KR | 20150058939 A | | 5/2015 |
| KR | 1020170040384 A | | 4/2017 |
| KR | 102530258 B1 | | 5/2023 |
| WO | 2005013322 A2 | | 2/2005 |
| WO | 2009134939 A3 | | 2/2010 |
| WO | 2011000629 A2 | | 1/2011 |
| WO | 2011000629 A3 | | 2/2011 |
| WO | 2013063738 A1 | | 5/2013 |
| WO | 2013066884 A1 | | 5/2013 |
| WO | 2019150740 A1 | | 8/2019 |

OTHER PUBLICATIONS

"*Cellink Corp.* v. *Manaflex LLC*—Answer and Counterclaims", Case No. 4:23-cv-04231-HSG, Nov. 15, 2023.

"*Cellink Corp.* v. *Manaflex LLC*—Complaint for Patent Infringement and Trade Secret Misappropriation", Aug. 18, 2023.

U.S. Appl. No. 16/034,899, Requirement For Restriction/Election, Aug. 20, 2020, 7 pgs.

U.S. Appl. No. 16/034,899, Non-Final Office Action mailed Jan. 21, 2021, 10 pgs.

U.S. Appl. No. 16/034,899, Notice of Allowance mailed Jul. 20, 2021, 9 pgs.

U.S. Appl. No. 17/383,129, Non Final Office Action mailed Jul. 19, 2023, 22 pgs.

U.S. Appl. No. 17/383,129, Restriction Requirement mailed Apr. 27, 2023, 6 pgs.

Baumann et al., "Laser remote cutting and surface treatment in manufacturing electrical machine, high productivity, flexibility, and perfect magnetic performance", Journal of Laser Applications 27, S28002, Feb. 26, 2015.

Chinese Application Serial No. 201880059192X, Office Action mailed Mar. 15, 2023.

European Application Serial No. 18832129.3, Search Report mailed Mar. 29, 2021.

Lang et al., "Optimization for high speed surface processing of metallic surfaces", institute for Manufacturing Technology, Downloaded From: https://www.spiedigitallibraryorg/conference-proceedings-of-spie on May 2, 2019.

Loctite. "Technical Data Sheet for Loctite 3888." Product 3888 (2003): 1-2. Loctite. Web. Aug. 8, 2015.

Luetke et al., "A Comparative Study on Cutting Electrodes for Batteries with Lasers", Published by Elsevier Ltd., 2011, access by www.sciencedirect.com.

Moorhouse et al., "Laser Drilling of Copper Foils for Electronics Applications," IEEE Transactions on Components and Packaging Technologies, vol. 30, No. 2, pp. 254-263, Jun. 2007. (Year: 2007).

Nagarajan Palavesam et al; "Roll-to-roll processing of film substrates for hybrid integrated flexible electronics" Flexible and Printed Electronics, Feb. 2018.

Rauscher et al., "New approach for all-in-one control of galvanometer scanners", Lasers in Manufacturing Conference 2017.

Van Kerschaver et al., Progress in Photovoltaics: Research and Applications, Back-contact Solar Cells: A Review, Wiley InterScience, 2005.

U.S. Appl. No. 17/383,129, Final Office Action mailed Feb. 13, 2024.

\* cited by examiner

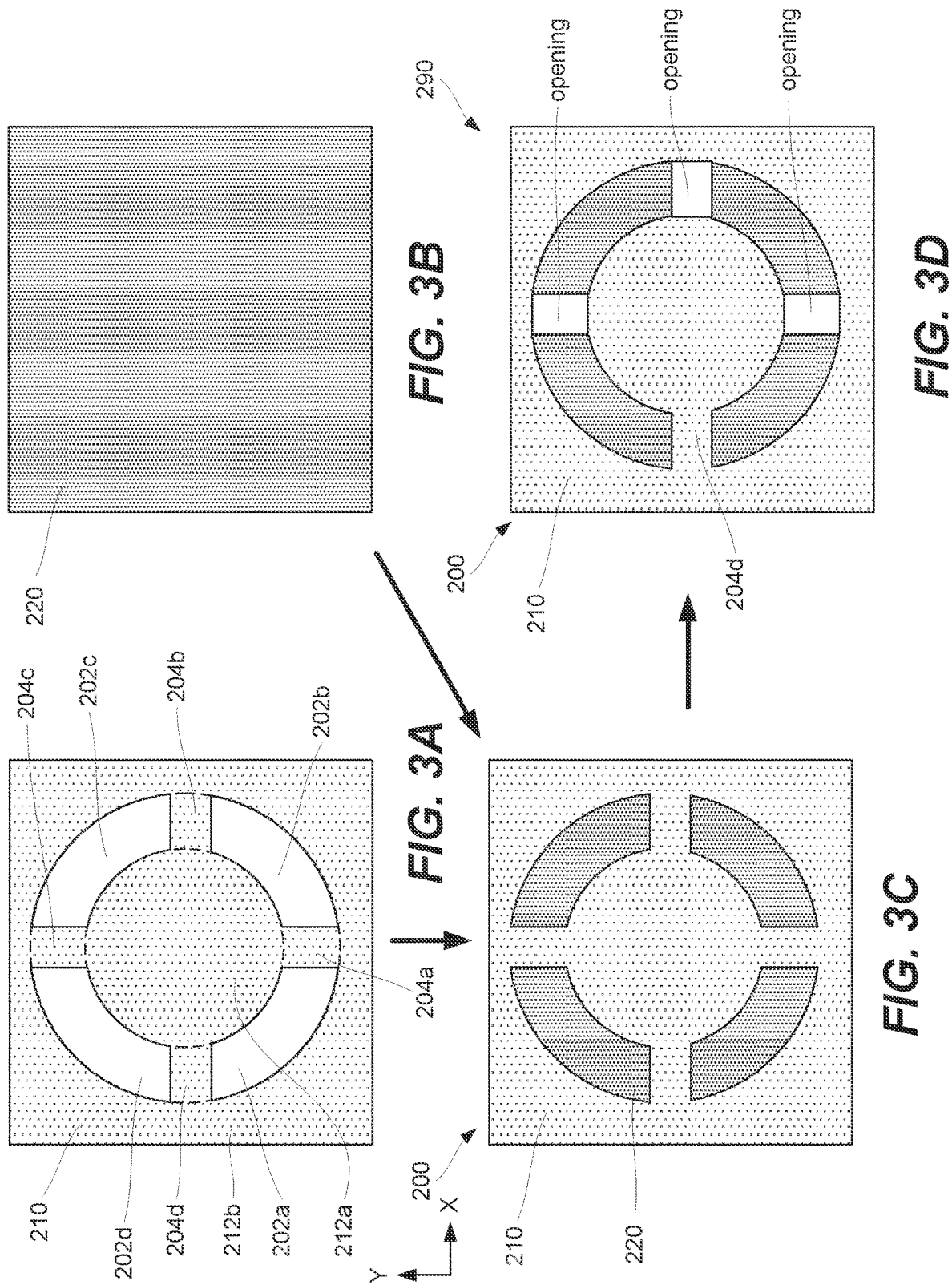

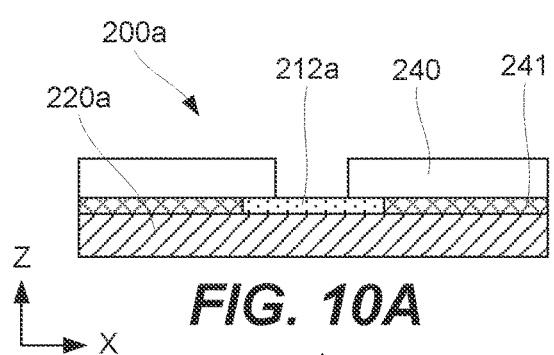
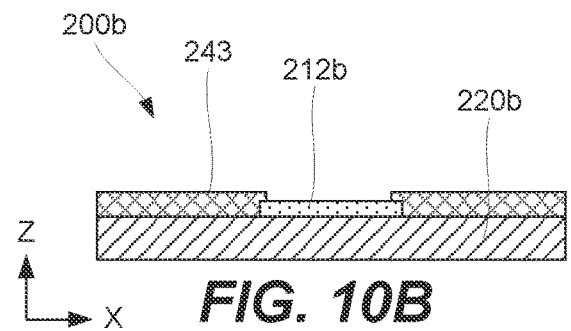
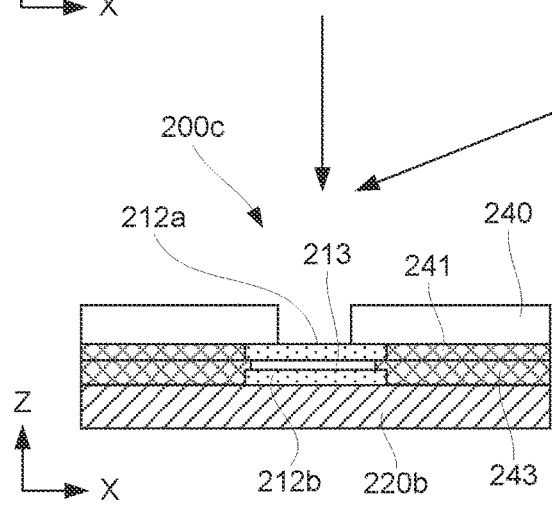
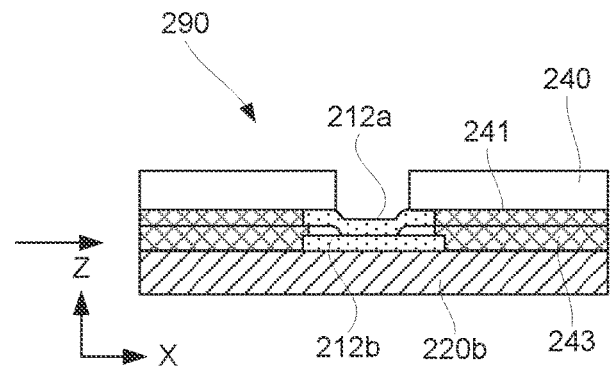
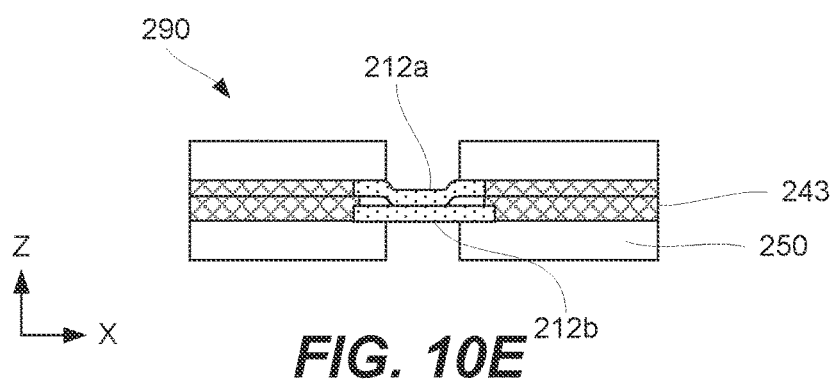
FIG. 10A
FIG. 10B
FIG. 10C
FIG. 10D
FIG. 10E

METHODS OF FORMING FLEXIBLE INTERCONNECT CIRCUITS

CROSS-REFERENCE TO RELATED APPLICATIONS

This application is a divisional of U.S. patent application Ser. No. 17/383,129 filed on 2021 Jul. 22, which is a continuation of U.S. patent application Ser. No. 16/034,899 filed on 2018 Jul. 13, which claims the benefit under 35 U.S.C. § 119(e) of U.S. Provisional Patent Application No. 62/531,995 filed on 2017 Jul. 13, all of which are incorporated herein by reference in their entirety for all purposes.

BACKGROUND

Electrical interconnects are used for many applications. Some examples of these applications include, but are not limited to, battery packs and solar arrays (interconnecting individual cells), vehicles (connecting different electrical components, e.g., interconnects used as wire harnesses), light fixtures, and many other types of electrical and electronic circuits. While many different kinds of electrical interconnects are currently available, most have limited functionality and are limited to a relatively small set of material choices. For example, a typical printed circuit board (PCB) has a dielectric base with conductive traces formed by chemical etching. During PCB fabrication, the dielectric base is exposed to a chemical etchant while forming the conductive traces. As such, the dielectric base has to be chemically resistant, which limits material options suitable for this base and, as a result, limits various functionalities of the PCB. For example, gaining direct access to the base-side surface of the conductive traces through the dielectric base may be difficult. Another example of electrical interconnects is a wire harness, formed by bundling individual wires. The wire harness is typically thick and heavy relative to its electrical conductive capabilities. Furthermore, the harness has poor heat transfer characteristics to the surroundings due to its shape and insulation of individual wires and overall bundling. The limited heat transfer necessitates using larger wires for a given current rating to reduce resistive heating. Furthermore, bundling wires into specific configurations can be a very labor-intensive task.

What is needed are new methods of forming interconnect circuits that provide new designs and functionalities of these circuits, including complex patterns and shapes of conductive layers, new materials, and features in insulating layers, thermal properties, low weight for a given electrical current, and the like.

SUMMARY

Provided are interconnect circuits and methods of forming thereof. A method may involve laminating a substrate to a conductive layer followed by patterning the conductive layer. This patterning operation forms individual conductive portions, which may be also referred to as traces or conductive islands. The substrate supports these portions relative to each other during and after patterning. After patterning, an insulator may be laminated to the exposed surface of the patterned conductive layer. At this point, the conductive layer portions are also supported by the insulator, and the substrate may optionally be removed, e.g., together with undesirable portions of the conductive layer. Alternatively, the substrate may be retained as a component of the circuit and the undesirable portions of the patterned conductive layer may be removed separately. These approaches allow the use of new patterning techniques as well as new materials for substrates and/or insulators.

In some embodiments, a method of forming an interconnect circuit comprises laminating a substrate to a conductive layer. The conductive layer comprises a first side and a second side, opposite the first side. The substrate is laminated to the second side of the conductive layer. The method further comprises patterning the conductive layer, while the conductive layer remains laminated to the substrate. Patterning the conductive layer forms a first conductive portion and a second conductive portion of the conductive layer, at least partially separated from the first conductive portion by a pattern opening. Pattern opening may be formed by techniques including, but not limited to, chemical etching, laser ablation, mechanical grinding, etc. However, other techniques are also within the scope. The substrate maintains the orientation of the first conductive portion relative to the second conductive portion during and after patterning. The method proceeds with laminating a first insulator to the first side of the conductive layer. The first insulator may be referred to as a permanent insulator and, in some embodiments, becomes a part of the final interconnect circuit. In some embodiments, the method may then proceed with removing the substrate from the conductive layer. In these embodiments, the substrate may be referred to as a temporary substrate. The first insulator maintains the orientation and position of the first conductive portion relative to the second conductive portion, while the substrate is being removed and after the substrate is removed. In other embodiments, the substrate is not removed and becomes a permanent layer in the circuit.

In some embodiments, the first insulator comprises an opening, prior to laminating the first insulator to the conductive layer. The opening may at least partially overlap with the first conductive portion of the conductive layer such that the first side of the first conductive portion remains at least partially exposed, through the opening, after laminating to the first insulator. In some embodiments, a portion of the first insulator forming the opening is laminated to the first side of the first conductive portion.

In some embodiments, patterning the conductive layer further forms a third portion of the conductive layer positioned between the first conductive portion and the second conductive portion of the conductive layer. For example, the third portion may be an undesirable leftover of the conductive layer. In these embodiments, the method further comprises removing the third portion of the conductive layer from the substrate prior to laminating the first insulator to the first side of the conductive layer. For example, the third portion may be peeled off from the substrate. Alternatively, the third portion may be removed after laminating the first insulator to the first side of the conductive layer. For example, the third portion of the conductive layer may be removed, while removing the substrate from the conductive layer. In other embodiments, the third portion of the conductive layer is removed after removing the substrate from the conductive layer.

In some embodiments, the third portion is connected to each of the first conductive portion and the second conductive portion and operable to support the first conductive portion and the second conductive portion. For example, the third portion may be operable as a connecting tab and may be used to maintain the orientation of the first conductive portion relative to the second conductive portion together with the substrate.

In some embodiments, patterning the conductive layer completely removes a portion of the conductive layer positioned between the first conductive portion and the second conductive portion. In other words, no further removal of any portions of the conductive layer is necessary after completing the patterning operation.

In some embodiments, patterning the conductive layer forms one or more pattern openings in the conductive layer. These one or more pattern openings may be disposed between the first conductive portion and the second conductive portion of the conductive layer. Each of the one or more pattern openings may comprise tapered sidewalls or substantially parallel sidewalls. The substantially parallel sidewalls may protrude above a portion of the first side of the conductive layer positioned away from the one or more pattern openings. In some embodiments, at least one of the one or more pattern openings has a variable width.

In some embodiments, the substrate comprises an adhesive layer contacting the first side of the conductive layer. Removing the substrate may comprise at least partially deactivating the adhesive layer. For example, a portion of the adhesive layer that overlaps with the first conductive portion and the second conductive portion of the conductive layer may be deactivated. In some embodiments, the remaining portion of the adhesive layer may remain activated.

Furthermore, patterning the conductive layer may form a third portion of the conductive layer positioned between the first conductive portion and the second conductive portion of the conductive layer. The remaining portion of the adhesive layer, which remains activated, may overlap with the third portion of the conductive layer. The method may further comprise removing the third portion of the conductive layer while removing the substrate. Deactivating at least the portion of the adhesive layer comprises an operation selected from the group consisting of UV deactivation and thermal deactivation.

These and other embodiments are described further below with reference to the figures.

BRIEF DESCRIPTION OF THE DRAWINGS

FIG. 3A illustrates an example of a pre-patterned conductive layer, in accordance with some embodiments.

FIGS. 3B, 3C, and 3D illustrate different stages of forming a device stack using the pre-patterned conductive layer of FIG. 3A, in accordance with some embodiments.

FIGS. 10A, 10B, 10C, 10D, and 10E illustrate schematic cross-sectional views of different stages while forming a multilayered interconnect circuit, in accordance with some embodiments.

DETAILED DESCRIPTION

Figure 1:
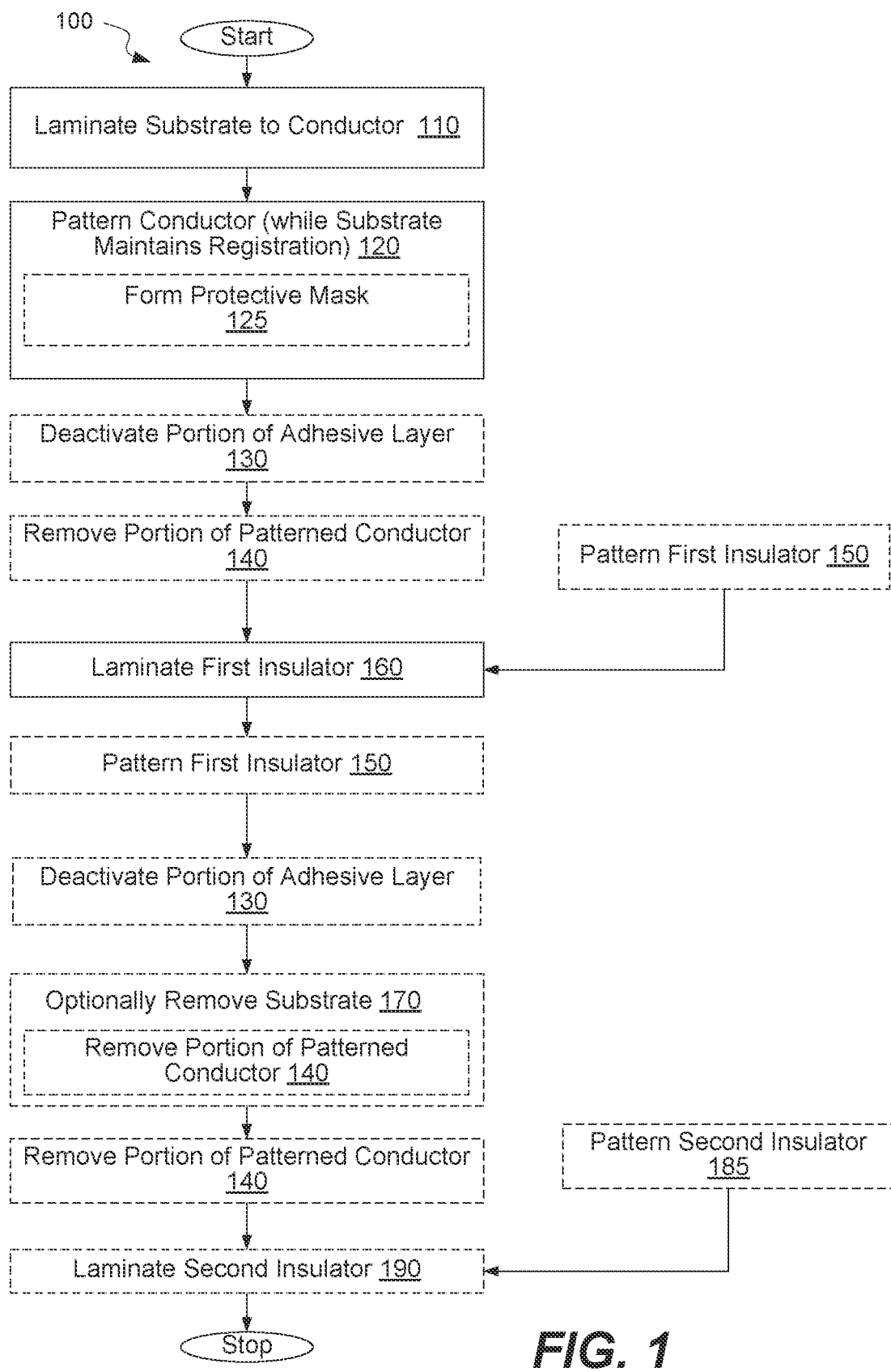
FIG. 1 is a process flowchart corresponding to a method of forming an interconnect circuit using a substrate, in accordance with some embodiments.

The ensuing detailed description of embodiments of this disclosure will be better understood when read in conjunction with the appended drawings. As used herein, an element or step recited in the singular and proceeded with the word "a" or "an" should be understood as not excluding the plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

INTRODUCTION

Interconnect circuits and, more specifically, flexible interconnect circuits described herein, may be used to form electrical connections to various electrical and electronic components and to carry electrical current and/or signals between these components. In some examples, the electrical current carried by an interconnect circuit may be as high as 10 Amperes or even as high as 100 Amperes or more. Furthermore, these interconnect circuits may be used for various aspects of thermal management. For example, an interconnect circuit may be operable as a heat conductor and/or as a heat sink for other electrical components (e.g., LED lights, batteries) and/or for non-electrical components (e.g., heat sinks, housings). The electrical components may produce heat during their operation, and this heat may be at least partially removed by or diffused away using the interconnect circuit. Furthermore, complex patterns may be formed by different conductive portions. Electrical connections to these portions may be formed through an insulator at various locations.

It should be noted that conventional approaches used to fabricate interconnect circuits, such as wire bundling or PCB processing, are generally not capable of producing circuits with the above-referenced characteristics, such as carrying large currents, thermal management, or forming connections through insulators. For example, PCB circuits and conventional flexible circuits require base layers that are chemically resistant and, as a result, are also thermally resistant. Wire harnesses have very poor thermal coupling to surrounding components and tend to be large and heavy.

Methods of forming interconnects or interconnect circuits described herein address various deficiencies of conventional processes and resulting interconnect circuits. Specifically, a described method uses a substrate for support while the conductive layer is being patterned. The substrate remains laminated to the conductive layer until additional support to the patterned portions is provided later. Specifically, a permanent insulator is laminated to the patterned conductive layer. Because this permanent insulator is not present while patterning the conductive layer is performed and therefore is not susceptible to damage during patterning, new techniques may be used for patterning without any concerns about damaging the permanent insulator. For example, chemical etching, electrochemical etching, mechanical cutting, laser cutting, laser ablation, waterjet cutting, kiss cutting, die-cutting, or male/female die cutting may be used. Furthermore, this approach allows using new materials and features (e.g., openings) for the permanent insulator. It should be noted that in some embodiments the substrate may be damaged while patterning the conductive layer as long as the substrate can maintain the orientation of different conductive layer portions during patterning and after patterning (e.g., until additional support is provided by the permanent insulator). In these embodiments, the substrate is later removed and, therefore, may be referred to as a temporary substrate. Alternatively, the substrate used for support while patterning the conductive layer may remain as a part of the final interconnect circuit, e.g., together with a later added insulator.

In addition to new patterning techniques, the use of a substrate may facilitate new materials for an insulator. As noted above, the insulator is not present during patterning and the support is provided by the substrate. Examples of new materials, which may be used for the insulator may include paper, cloth, non-etch-resistant polymers, glass, and the like.

Furthermore, in some embodiments, the insulator, which is added after patterning, may include openings. These openings may be used for direct electrical, mechanical, and/or thermal coupling to the conductor through the openings. Optionally, these openings may be formed prior to lamination of the insulator to the conductive layer and may be referred to as "back-bared" circuit openings. The registration between the openings in the insulator and the patterned portions of the conductive layer may be controlled during the lamination process (e.g., using a vision registration system). The areas of the patterned portions overlapping with the openings in the insulator may be referred to as contact pads. It should be noted that such openings are very difficult and/or expensive to fabricate using conventional techniques where insulators are present during patterning or, more specifically during etching. Specifically, in conventional processes, an insulator is used as a base layer against which etching takes place. Further aspects of "back-bared" circuit openings in the interconnect circuit are described below.

For purposes of this disclosure, the term "interconnect" is used interchangeably with the term "interconnect circuit". The term "conductor" is used interchangeably with the term "conductive layer." The term "insulator" is used interchangeably with the following terms: "insulating layer," "permanent insulator", and/or "electrical insulator." It should be noted that the permanent insulator may be thermally conductive, even though it is electrically insulating. Furthermore, in some embodiments, the substrate may be electrically insulating or electrically conductive. The substrate is removed from a device stack during its fabrication.

Process and Device Examples

FIG. 1 illustrates a process flowchart corresponding to method 100 of forming interconnect circuit 290, in accordance with some embodiments. Examples of interconnect circuit 290 are shown in FIGS. 8B-8D, 10D, and 10E and further described below. An assembly of components prior to forming final interconnect circuit 290 may be referred to as device stack 200. Various examples of device stack 200, at various stages of method 100, are shown in FIGS. 2A, 3C, 3D, 4A-4B, 5A, 5B, 6A-6F, 8A, 10D, and 10E. Device stack 200 may be also referred to as a partially fabricated interconnect circuit and may include substrate 220. Substrate 220 may be removed prior to forming final interconnect circuit 290 or retained in interconnect circuit 290, e.g., as one of the insulators. Method 100 may be performed using various types of processing equipment, which are described below with reference to specific operations. In some embodiments, operations of method 100 are performed in a roll-to-roll format.

Method 100 may commence with laminating substrate 220 to conductive layer 210 during operation 110 (shown as a block in FIG. 1). Operation 110 may comprise one or more lamination techniques including, but not limited to, rolling, vacuum lamination, in-line lamination, roll-to-roll lamination, and/or sheet-to-sheet lamination. In some embodiments, a combination of pressure and heat may be used to laminate conductive layer 210 to substrate 220.

Figure 2A:
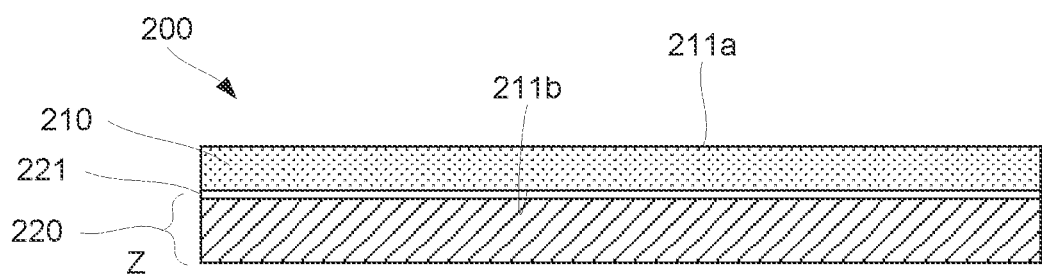
FIG. 2A illustrates an example of a device stack after laminating the substrate to a conductive layer, in accordance with some embodiments.

As shown in FIG. 2A, conductive layer 210 has first side 211a and second side 211b, opposite of first side 211a. The distance between first side 211a and second side 211b is a thickness of conductive layer 210, extending in the Z direction. The thickness of device stack 200 and later the thickness of interconnect circuit 290 also extends in the same direction. Substrate 220 is laminated to second side 211b of conductive layer 210, forming device stack 200. First side 211a may remain exposed at the end of operation 110. First side 211a may be used to access conductive layer 210 during later processing of device stack 200, e.g., patterning of conductive layer 210.

Figure 2B:
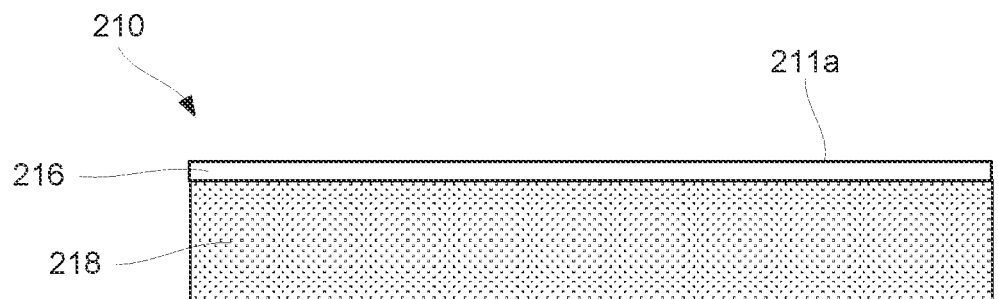
FIGS. 2B, 2C, and 2D illustrate two examples of the conductive layer comprising a surface sublayer, in accordance with some embodiments.

Conductive layer 210 may be formed from aluminum, titanium, nickel, copper, steel, and/or alloys comprising these metals. In some embodiments, conductive layer 210 has a uniform composition through its thickness. Alternatively, conductive layer 210 comprises base sublayer 218 and surface sublayer 216, having different compositions. One example is shown in FIG. 2B. Surface sublayer 216 may form first side 211a. As such, substrate 220 may be laminated to base sublayer 218, while a permanent insulator may be laminated over surface sublayer 216. Surface sublayer 216 may be specifically selected to have a high adhesion strength to the permanent insulator.

Base sublayer 218 may comprise a metal selected from the group consisting of aluminum, titanium, nickel, copper, steel, and alloys comprising these metals (e.g., to provide high electrical and thermal conductivities at minimal cost). Surface sublayer 216 may comprise a metal selected from the group consisting of tin, lead, zinc, nickel, silver, palladium, platinum, gold, indium, tungsten, molybdenum, chrome, copper, alloys thereof, organic solderability preservative (OSP), or other electrically conductive materials (e.g., to protect base sublayer 218 from oxidation, improve surface conductivity when forming electrical and/or thermal contact to a device, improve adhesion to conductive layer 210, and/or other purposes). For example, aluminum may be used for base sublayer 218. While aluminum has good thermal and electrical conductivity, it forms a surface oxide when exposed to air. Therefore, coating aluminum with surface sublayer 216 before aluminum oxide is formed mitigates this problem.

Surface sublayer 216 may have a thickness of between about 0.01 micrometers and micrometers or, more specifically, between about 0.1 micrometers and 1 micrometer. For comparison, the thickness of base sublayer 218 may be between about 10 micrometers and 1000 micrometers or, more specifically, between about 100 micrometers and 500 micrometers. As such, base sublayer 218 may represent at least about 90% or, more specifically, at least about 95% or even at least about 99% of conductive layer 210 by volume.

Figure 2C:
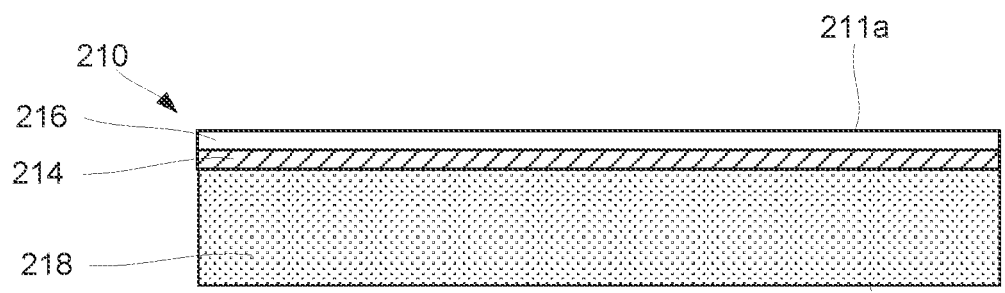

In some embodiments, conductive layer 210 further comprises one or more intermediate sublayers 214 disposed between base sublayer 218 and surface sublayer 216 as, for example, shown in FIG. 2C. Intermediate sublayer 214 has a different composition than each of base sublayer 218 and surface sublayer 216 and may be used, for example, to prevent intermetallic formation between base sublayer 218 and surface sublayer 216. For example, intermediate sublayer 214 may comprise a metal selected from the group consisting of chromium, titanium, nickel, vanadium, zinc, and copper.

Figure 2D:
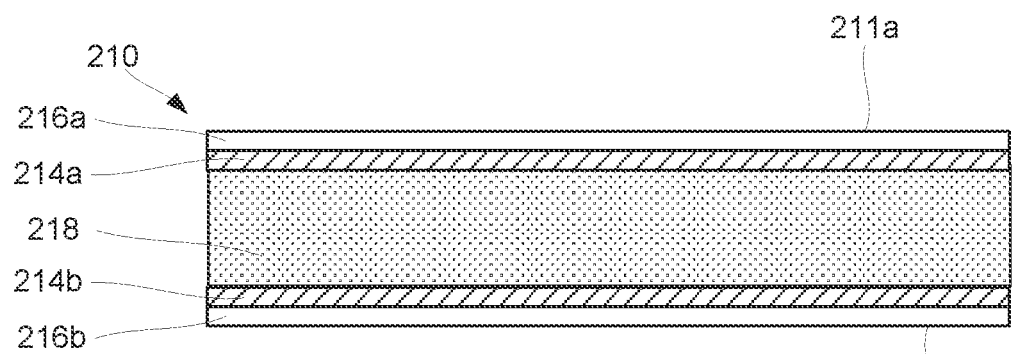

FIG. 2D is another example of conductive layer 210 comprising two intermediate sublayers 214a and 214b and two surface sublayers 216 disposed over base sublayer 218. Surface sublayers 216a and 216b form first side 211a and second side 211b of conductive layer 210. The composition of two intermediate sublayers 214a and 214b may be the same or different. Likewise, the composition of two surface sublayers 216a and 216b may be the same or different. For example, one surface sublayer 216a may be tailored for one type of function (e.g., adhering to one type of a permanent insulator) while another surface sublayer 216b may be tailored to the other type.

Returning to FIG. 2A, the overall thickness of conductive layer 210 may be between about 10 micrometers and 1000 micrometers or, more specifically, between about 50 micrometers and 500 micrometers. Conductive layer 210 may be a continuous sheet of foil, which is particularly suitable for roll-to-roll operations. In some embodiments, conductive layer 210 may comprise a rolled metal foil. In contrast to the vertical grain structure associated with electrodeposited foil and/or plated metal, the horizontally-elongated grain structure of the rolled metal foil may help to increase the resistance to crack propagation in conductive layer 210 under cyclical loading conditions. This may help increase the fatigue life of interconnect circuit 290.

In some embodiments, conductive layer 210 may be un-patterned prior to, during, and immediately after completing lamination operation 110. Alternatively, conductive layer 210 may be partially patterned prior to operation 110. For example, FIG. 3A illustrates partially patterned conductive layer 210 comprising pre-patterned openings 202a, 202b, 202c, and 202d. These pre-patterned openings 202a-202d may be positioned in such a way that different portions of partially patterned conductive layer 210 remain supported relative to each other by connecting tabs 204a, 204b, 204c, and 204d disposed between pre-patterned openings 202a-202d. FIG. 3B illustrates substrate 220 prior to laminating it to partially patterned conductive layer 210. FIG. 3C illustrates stack 200 with partially patterned conductive layer 210 laminated to substrate 220. In this stack 200, first conductive portion 212a is also supported relative to second conductive portion 212b by substrate 220. As such, some or all connecting tabs 204a-204d may be removed. FIG. 3D illustrates stack 200 after connecting tabs 204a-204c have been removed while further patterning conductive layer 210.

Substrate 220, which is laminated to conductive layer 210 during operation 110, may be formed from polyimide (PI), polyethylene terephthalate (PET), polyethylene naphthalate (PEN), polyethylene (PE), polypropylene (PP), polyether ether ketone (PEEK), metal foil, and/or paper. Substrate 220 may be resistant to chemical etchants in some embodiments.

Substrate 220 may include adhesive layer 221 as, for example, shown in FIG. 2A. Adhesive layer 221 attaches (e.g., temporarily) substrate 220 to conductive layer 210. Adhesive layer 221 may comprise a pressure-sensitive adhesive (PSA), thermally activated/deactivated adhesive, light-activated/deactivated adhesive, and the like. Specifically, adhesive layer 221 may be selectively activatable or de-activatable using heat, UV, IR, or any other suitable techniques. For purposes of this disclosure, activation or de-activation of adhesive layer 221 is defined as an increase or reduction of the adhesion strength of adhesive layer 221 to conductive layer 210. Activation and/or deactivation may be selective and may be used to help with the removal of substrate 220 from conductive layer 210 and/or to help with removal of undesirable portions of conductive layer 210 (after patterning conductive layer 210) together with substrate 220. Various aspects of activation and/or deactivation of adhesive layer 221 are described below with reference to operation 130.

Returning to FIG. 1, method 100 may proceed with patterning conductive layer 210 during operation 120 (shown as a block in FIG. 1). This operation forms first conductive portion 212a and second conductive portion 212b of conductive layer 210 such that second conductive portion 212b may be at least partially separated from first conductive portion 212a by one or more pattern openings 230a-230b. In this example, first conductive portion 212a and second conductive portion 212b are formed from the same conductive layer, positioned on the same level, and offset along the width of stack 200. This arrangement may be referred to as horizontal stacking of first conductive portion 212a and second conductive portion 212b to distinguish from vertical stacking described below with reference to FIGS. 10A-10E.

A full separation of first conductive portion 212a and second conductive portion 212b is shown in FIGS. 4B-4C or FIGS. 5A-5B. In this example, first conductive portion 212a and second conductive portion 212b are electrically isolated. A partial separation of first conductive portion 212a and second conductive portion 212b is shown in FIG. 3D. In this example, connecting tab 204d connects first conductive portion 212a and second conductive portion 212b. It should be noted that connecting tab 204d, first conductive portion 212a, and second conductive portion 212b may be all formed from the same sheet and therefore are monolithic. Connecting tab 204d may be operable as a fusible link between first conductive portion 212a and second conductive portion 212b.

Figure 4A:
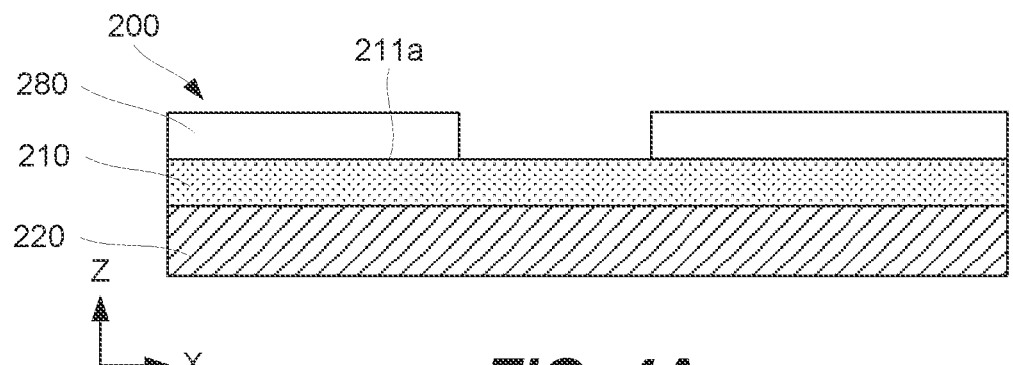
FIG. 4A illustrates an example of the device stack with a protective mask formed over the conductive layer, in accordance with some embodiments.
Figure 4B:
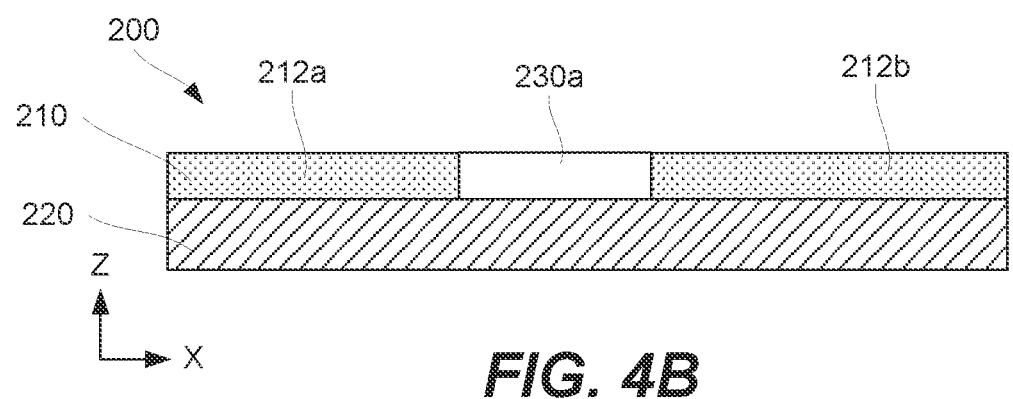
FIGS. 4B and 4C illustrate two views of the device stack with a pattern opening formed in the conductive layer, in accordance with some embodiments.
Figure 4C:
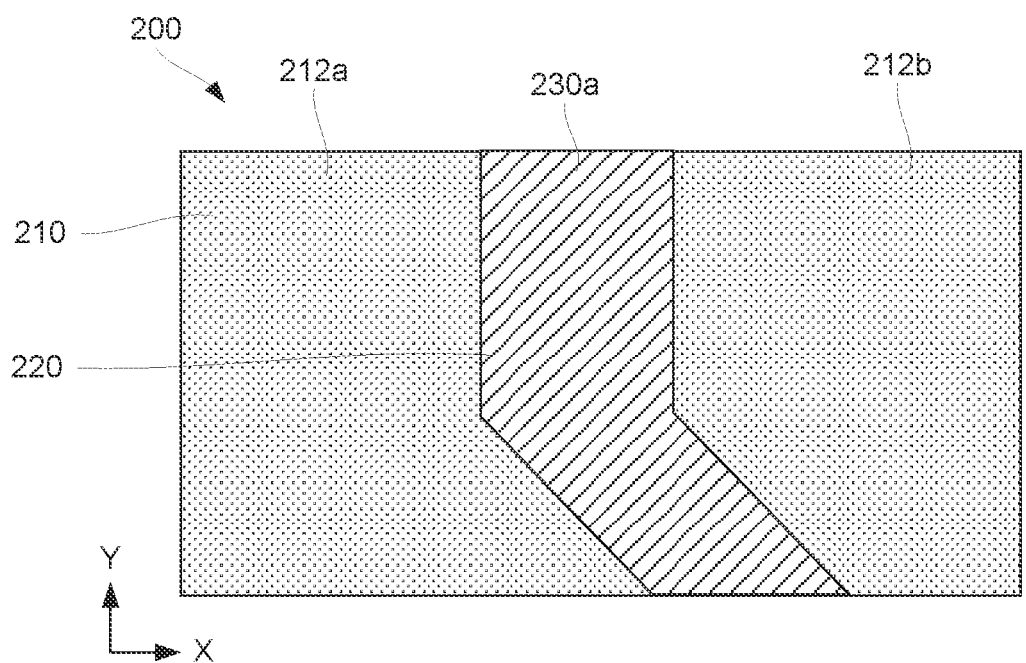

In some embodiments, all undesirable portions of conductive layer 210 are removed during patterning operation 120 as, for example, schematically shown in FIGS. 4B and 4C. The removal of these undesirable portions depends on the patterning technique and separation between first conductive portion 212a and second conductive portion 212b, as further described below. In these embodiments, optional operation 140, which involves removal of the remaining undesirable portions of conductive layer 210, is not performed.

Figure 5A:
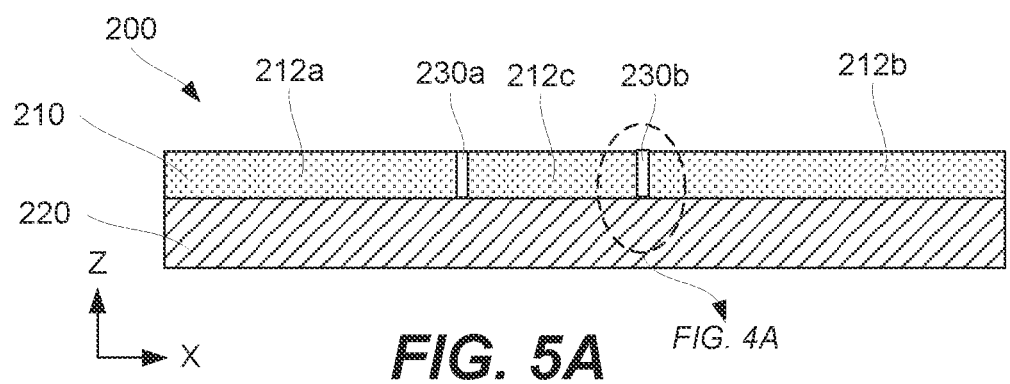
FIGS. 5A and 5B illustrate two views of the device stack with two pattern openings or slits formed in the conductive layer and separating different portions of the conductive layer, in accordance with some embodiments.
Figure 5B:
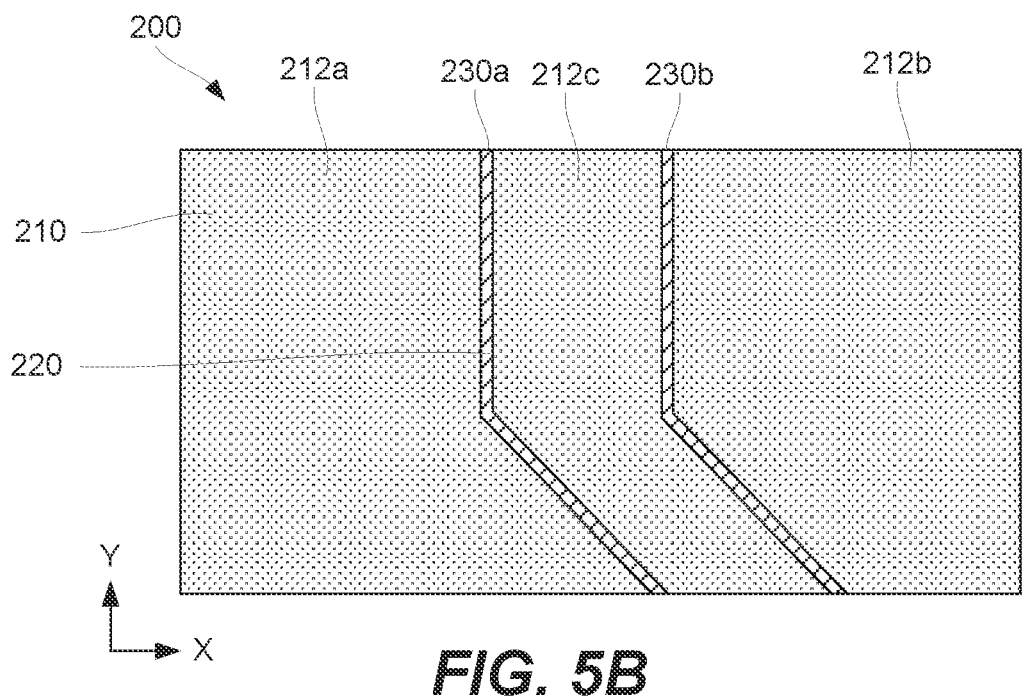

Alternatively, some undesirable portions of conductive layer 210 may remain after completion of patterning operation 120 as, for example, schematically shown in FIGS. 5A-5B. Specifically, third portion 212c of conductive layer 210 may be disposed between first conductive portion 212a and second conductive portion 212b. Third portion 212c may be separated from each of first conductive portion 212a and second conductive portion 212b by slits or pattern openings 230a-230b, both of which are referred to as pattern openings 230a-230b for conciseness. First conductive portion 212a and second conductive portion 212b provide no or insignificant support to third portion 212c. Instead, all or most of the support to third portion 212c is provided by substrate 220. This feature allows the removal of third portion 212c (e.g., together with the removal of substrate 220), while preserving the relative orientation of first conductive portion 212a and second conductive portion 212b.

Patterning operation 120 is performed while conductive layer 210 is laminated to substrate 220 as, for example, schematically shown in FIGS. 4A-4C and FIGS. 5A-5B. During and after operation 120, substrate 220 maintains the orientation of first conductive portion 212a relative to second conductive portion 212b. Therefore, first conductive portion 212a and second conductive portion 212b may be at least partially or even fully separate during operation 120.

Pattern openings 230a-230b formed in conductive layer 210 during operation 120 may not extend through substrate 220 as, for example, shown in FIGS. 4B and 5A. Alternatively, pattern openings 230a-230b may extend through both conductive layer 210 and substrate 220 as, for example, shown in FIG. 3D. In either case, substrate 220 is operable to maintain the orientation of first conductive portion 212a relative to second conductive portion 212b.

It should be noted that, in some embodiments, substrate 220 may be partially damaged and/or partially removed (e.g., dissolved) during patterning operation 120. The damage may be substantial, as long as substrate 220 is still capable of maintaining the relative orientations of first conductive portion 212a and second conductive portion 212b. In some embodiments, the damage to substrate 220 can be even desirable and relied on, for example, to facilitate the removal of substrate 220 during operation 170. Allowing substrate 220 to be damaged opens the door to new materials for substrate 220 (e.g., relative to the substrates used in permanent printed circuit production that are later retained as parts of these circuits). Moreover, the absence of permanent insulators from operation 120 also opens the door to new permanent insulator materials and features, owing to the fact that the permanent insulator need not withstand the patterning process carried out during operation 120.

Patterning operation 120 may involve one or more of the following processes: chemical etching, electrochemical etching, mechanical cutting, laser cutting, and/or laser ablation. Each of these techniques will now be described in more detail. Chemical etching may be also referred to as chemical milling or photochemical machining. Chemical etching involves forming protective mask 280 during operation 125 (shown as a block in FIG. 1). FIG. 4A illustrates protective mask 280 selectively covering first side 211a of conductive layer 210. Comparing FIGS. 4A and 4B, protective mask 280 covers two portions of first side 211a corresponding to first conductive portion 212a and second conductive portion 212a of conductive layer 210 retained during operation 120. The uncovered/exposed portions of first side 211a correspond to removed portions of conductive layer 210, e.g., forming pattern opening 230a as, shown in FIG. 4B. Protective mask 280 may be optionally formed either before or after laminating conductive layer 210 to substrate 220.

When stack 200 with protective mask 280 is submerged in an etching solution, metal atoms in the exposed portions of conductive layer 210 react with the etching solution causing the removal of these exposed portions and the formation of pattern opening 230a. Protective mask 280 blocks other portions of conductive layer 210 from the etching solution. As such, first conductive portion 212a and second conductive portion 212a (disposed under protective mask 280) are retained. Various considerations of chemical etching involve the rate of etching, uniformity of etchant concentrations, time, and temperature conditions. The etching solution may be a ferric chloride solution, ammonium persulfate solution, hydrogen peroxide solution, and the like. Chemical etching is a relatively fast and low-cost method for patterning conductive layer 210. Furthermore, chemical etching is capable of removing all undesirable portions of conductive layer 210 as schematically shown in FIGS. 4B and 4C.

Figure 7A:
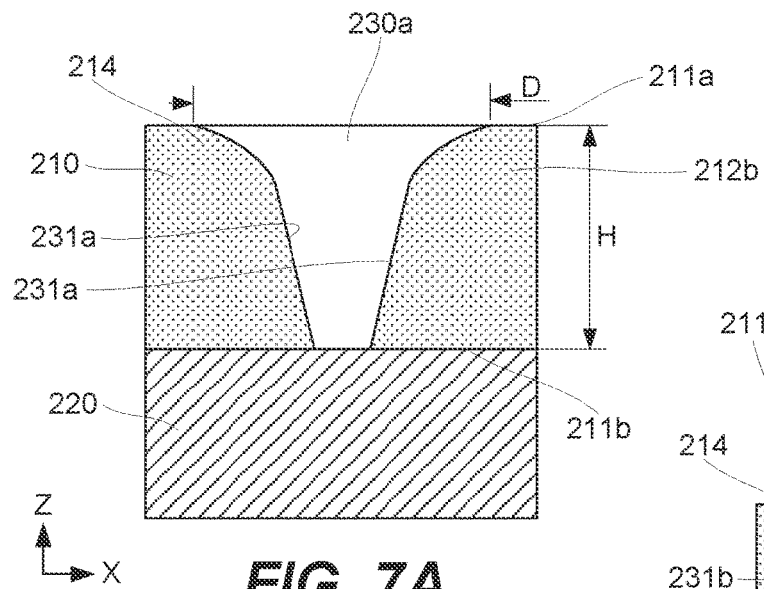
FIGS. 7A, 7B, and 7C illustrate schematic cross-sectional views of different examples of the pattern opening formed in the conductive layer, in accordance with some embodiments.

FIG. 7A illustrates an example of pattern opening 230a produced by chemical etching. Specifically, this pattern openings 230a comprises tapered sidewalls 231a. Pattern opening 230a is smaller at the interface with substrate 220 and larger further away from substrate 220. This tapered shape may be a result of various factors, such as longer etching duration at first side 211a (than at second side 211b), etchant concentration gradient within opening 230a, and the like. It should be noted that tapered sidewalls 231a may have a smooth transition to first side 211a and have no sharp edges or burrs. This smooth transition may be useful in some types of interconnect circuits 290, e.g., circuits that are used to transmit high-voltage signals.

Electrochemical etching is a variation of chemical etching, which uses an electrolyte solution and a direct current (DC) power source. Conductive layer 210 may be connected to a positive terminal of the DC power source, while the negative terminal is connected to an electrode disposed in the electrolyte solution and may be referred to as a cathode. Conductive layer 210 or at least unmasked portions thereof are exposed to the electrolyte solution and may be referred to as an anode. When the DC voltage is applied, the metal of the anode is dissolved and converted into the same cation as in the electrolyte. At the same time, an equal amount of the cation in the solution is converted into metal and deposited on the cathode. It should be noted that first conductive portion 212a and second conductive portion 212b may be masked by protective mask 280 (FIG. 4A) to isolate these portions from the electrolyte. In the same or other examples, first conductive portion 212a and second conductive portion 212b may be electrically disconnected from the DC power source, while other undesired portions may be connected to the positive terminal, which causes their dissolution. For example, when third portion 212c is present, it may be physically separated and electrically disconnected from first conductive portion 212a and second conductive portion 212b by previously formed pattern openings 230a and 230b as, for example, shown in FIGS. 5A-5B. In this example, pre-patterned conductive layer 210 may be formed by other methods, e.g., kiss cutting or laser cutting.

Thereafter, third portion 212c may be removed from this structure using electrochemical etching to arrive at a structure shown in FIGS. 4B-4C. In other words, mechanical cutting or laser cutting may be used for pre-patterning (e.g., pattern openings 230a and 230b), while electrochemical etching may be later used to dissolve all remaining undesirable portions (e.g., third portion 212c).

Following chemical etching or electrochemical etching, any remaining protective mask 280 may be removed or stripped via dissolution in a solvent or basic solution, or via plasma etching, for example. Once protective mask 280 is removed, the remaining portions of conductive layer 210 may be cleaned or polished to ensure that no protective mask residue remains on the conductive layer 210.

Yet another technique that can be used to form pattern opening 230a is mechanical cutting. Mechanical cutting may involve kiss cutting, die-cutting, steel-rule die-cutting, male/female die-cutting, selective grinding, slitting, punching, and the like. During some forms of mechanical cutting, conductive layer 210 comes in contact with a cutting tool that separates two portions of conductive layer 210, typically by applying a shear force at the cutting location. In this example, pattern opening 230a may be a slit rather than a gap formed by the removal of a portion of conductive layer 210. One example of device stack 200 processed using mechanical cutting is shown in FIGS. 5A and 5B.

Figure 7B:
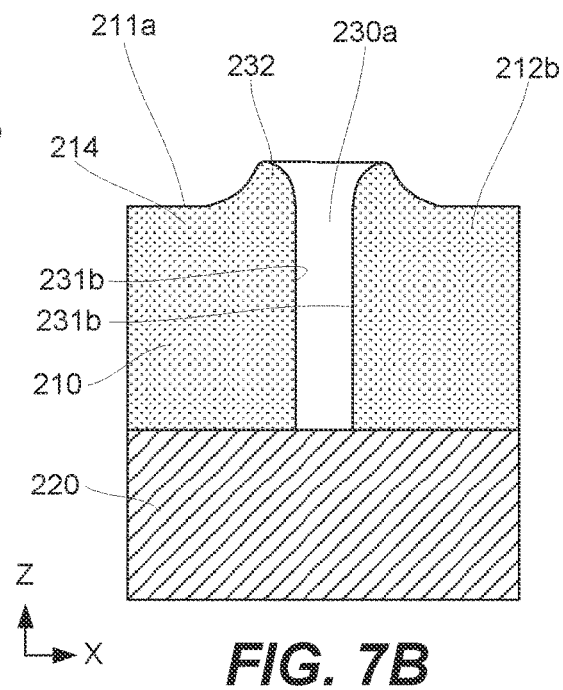

Mechanical cutting can be very fast, with cycle times on the order of a few seconds, and environmentally friendly (e.g., it does not require chemicals or produce fumes). However, the mechanical cutting may create burrs and other features at the interface of first side 211a and pattern opening 230a. For example, FIG. 7B illustrates sidewalls 231b (which may be parallel) protruding above the portion of first side 211a of conductive layer 210 positioned away from one or more pattern openings 230a. This feature may be referred to as raised interface 232. In some embodiments, mechanical cutting requires special tools that may be different for each pattern of conductive layer 210. For example, while linear slits can be easily formed with a roll slitting example of mechanical cutting, non-linear cuts are more difficult and may require custom dies. Fortunately, modern die-making techniques (e.g., flexible magnetic dies for rotary die-cutting) have greatly reduced the cost and fabrication time associated with mechanical die-cutting. Finally, depending on the type of cutting being performed, the mechanical cutting may or may not remove all undesirable portions of conductive layer 210 that are not necessary (e.g., third portion 212c shown in FIGS. 5A and 5B). Mechanical kiss cutting, for example, would not generally remove third portion 212c, and operation 140 would be required Laser cutting is another technique that may be used to form pattern opening 230a. During laser cutting, a laser beam is guided along the cutting path by moving the beam and/or moving conductive layer 210. The laser beam is focused at or around first side 211a which causes the material of conductive layer 210 to melt, burn, vaporize away, and/or be removed by flowing gas near the laser cutting head. Laser cutting may produce high-quality surface finishes and, in particular, straight and parallel sidewalls 231b of pattern opening 230a as, for example, shown in FIG. 7C (although in some laser cutting processes, a profile more similar to FIG. 7B may be produced). In some embodiments, interface 232 between first side 211a and sidewalls 231b is defined by the angle of between 80° and 100° or about 90°. Furthermore, first side 211a may be substantially flat (thickness deviation of less than 10%) without a raised portion around opening 230a. Because the laser beam is focused, pattern opening 230a may be very narrow even for relatively thick conductive layers 210. For example, an aspect ratio (defined as the ratio of trace thickness to width) of pattern opening 230a formed by laser cutting may be between about 1:5 and 1:0.05 or, more specifically, between 1:1 and 1:0.1. One example of device stack 200 processed using laser kiss cutting, which is analogous to mechanical kiss cutting, is shown in FIGS. 5A and 5B.

Finally, laser ablation may be used to form pattern opening 230a. Laser ablation is a variation of laser cutting, which is configured to remove larger portions or areas of conductive layer 210 than pattern openings 230a-230b. Specifically, traditional laser cutting does not generally remove residual portions of conductive layer 210 that are not necessary (e.g., third portion 212c shown in FIGS. 5A and 5B), while laser ablation may be used to remove this portion yielding stack 200 similar to an example shown in FIGS. 4B and 4C.

In some embodiments, patterning conductive layer 210 during operation 120 comprises two or more different techniques, such as chemical etching, electrochemical etching, mechanical cutting, laser cutting, and laser ablation (e.g., used in a sequence of patterning operations). For example, a combination of mechanical cutting and laser ablation may be used, with mechanical cutting being used to form one or more pattern openings 230a-230b, and laser ablation is used to remove all remaining undesirable portions (e.g., between pattern openings 230a-230b). Furthermore, a combination of etching and mechanical cutting, laser cutting and laser ablation, mechanical cutting and laser ablation, and/or laser cutting and etching may be used in a similar manner.

Figure 6A:
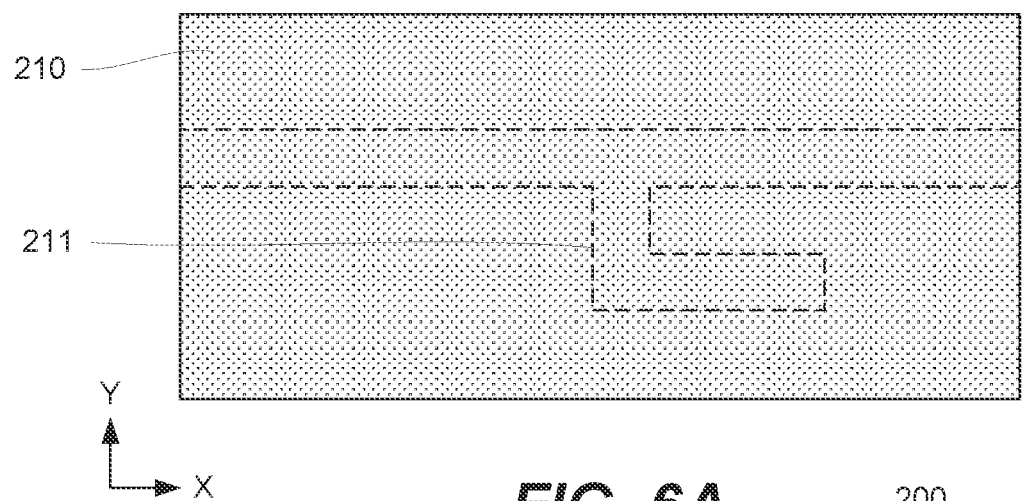
FIG. 6A illustrates an example of a conductive layer pattern, in accordance with some embodiments.
Figure 6B:
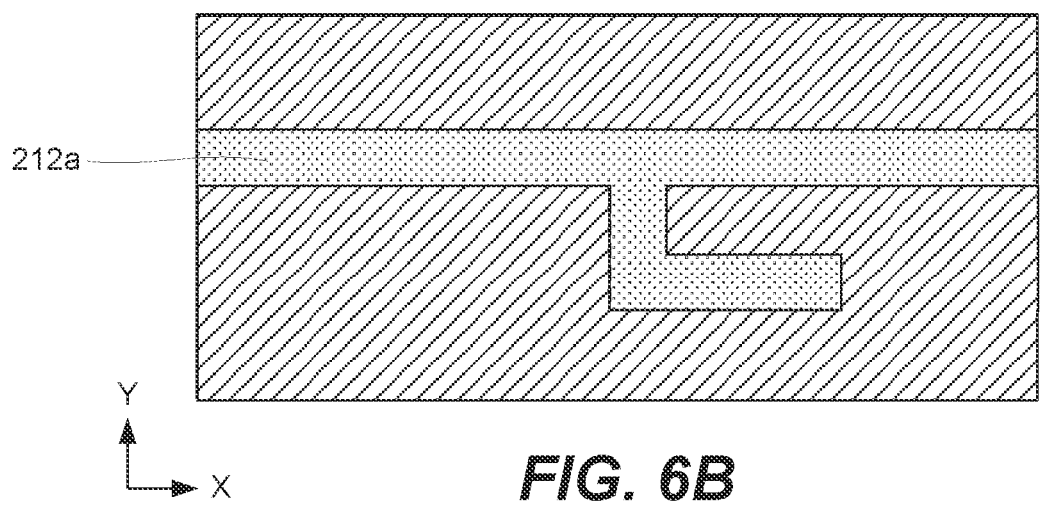
FIG. 6B illustrates an example of the patterned conductive layer, in its final form, corresponding to the pattern of FIG. 6A, in accordance with some embodiments.
Figure 6C:
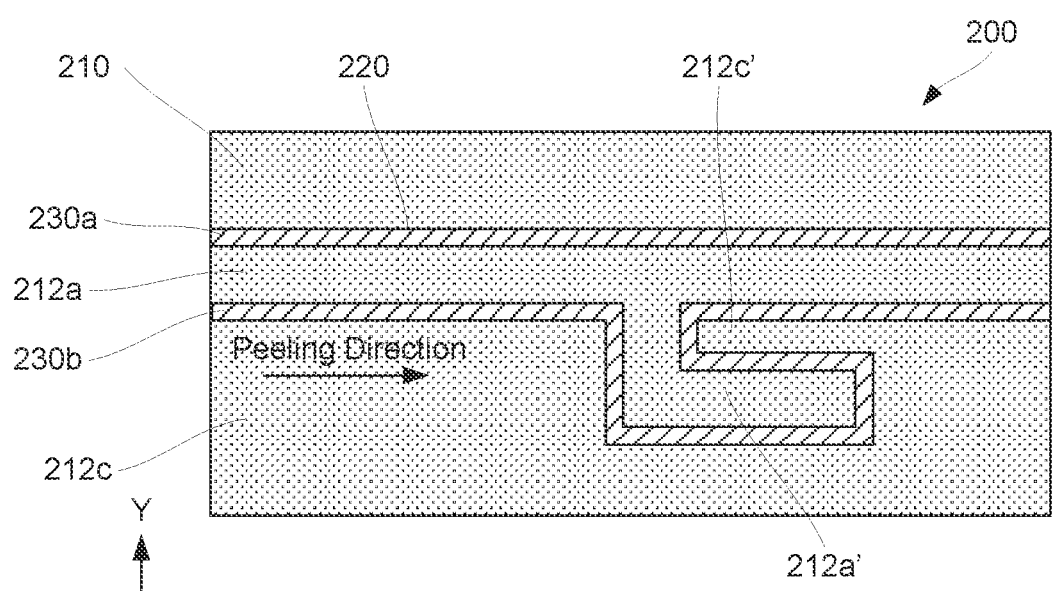
FIGS. 6C, 6D, 6E, and 6F illustrate different examples of pattern openings formed in the conductive layer and used to form the patterned conductive layer of FIG. 6B, in accordance with some embodiments.
Figure 6D:
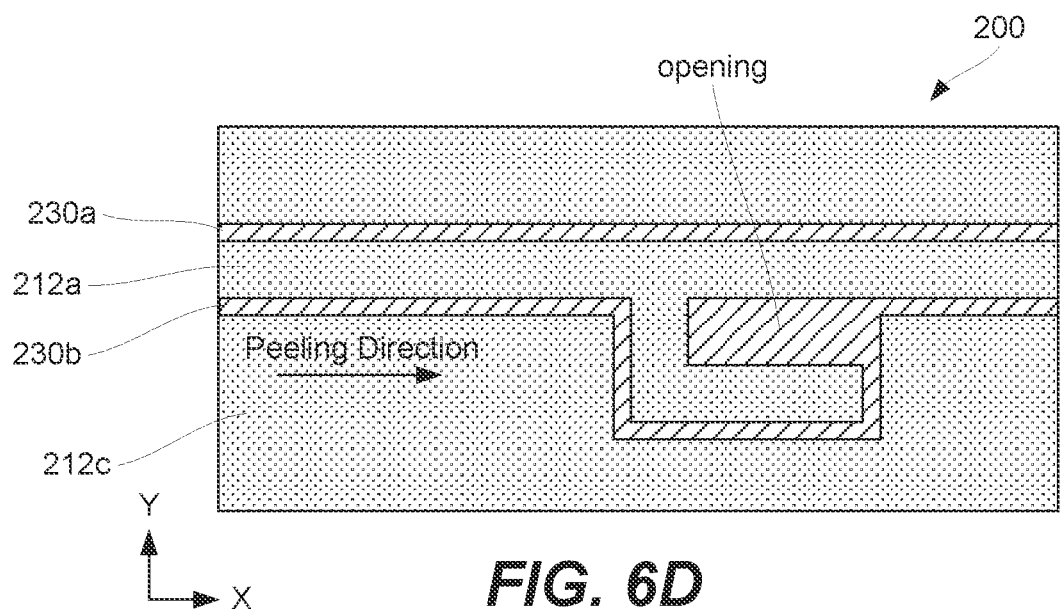
Figure 6E:
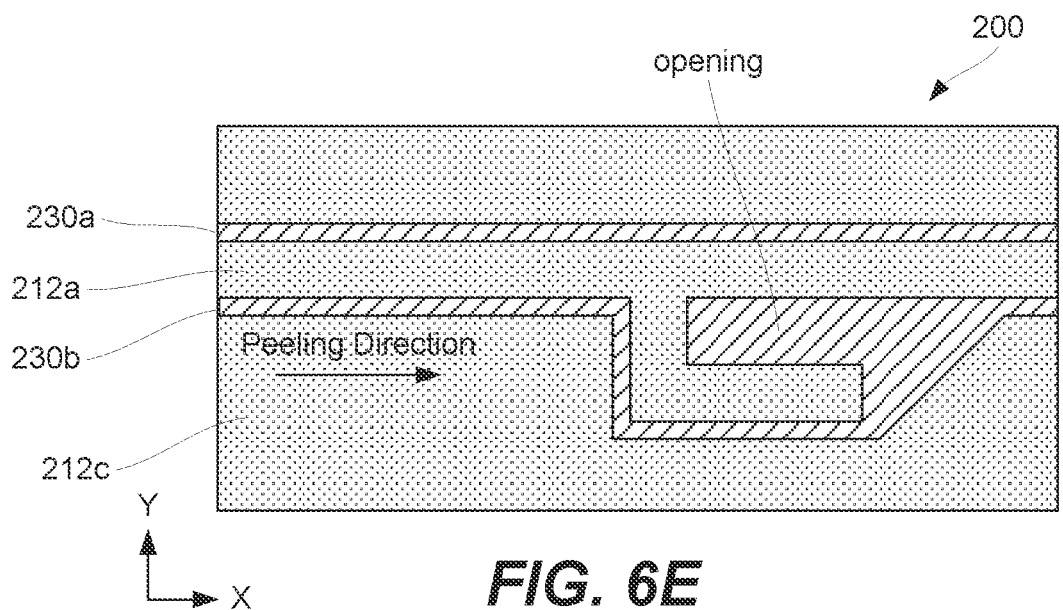
Figure 6F:
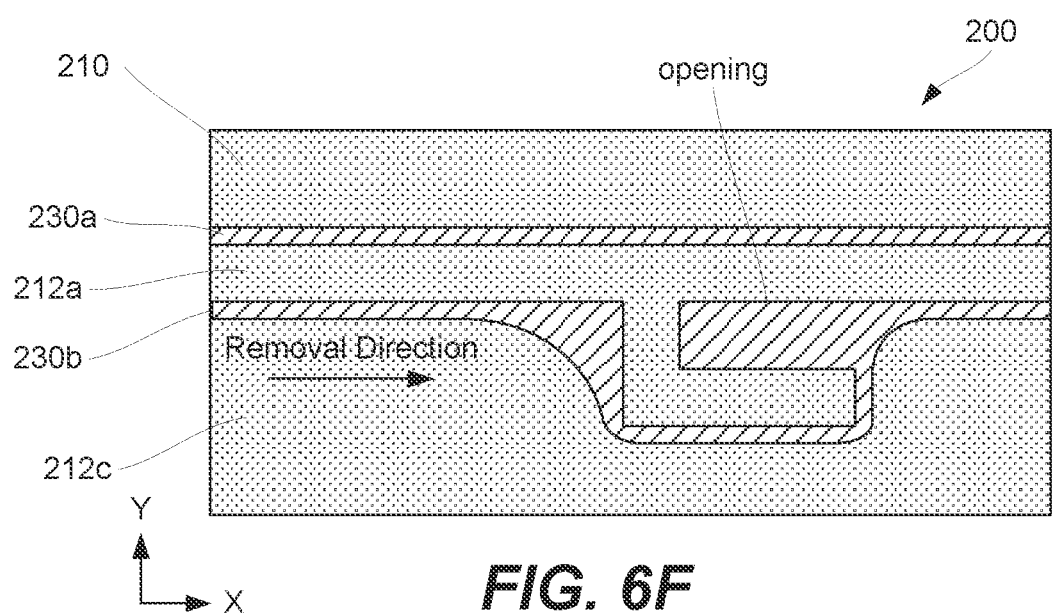

In some embodiments, one or more pattern openings 230a-230b formed during operation 120 may have a variable width as, for example, is shown in FIGS. 6D-6F. This variability may be used to assist with the removal of undesirable portions of conductive layer 210 as will now be described in more detail with reference to FIGS. 6A-6F. Specifically, FIG. 6A illustrates one example of desired pattern 211 shown with dashed lines on conductive layer 210. Pattern 211 may correspond, for example, to first conductive portion 212a shown in FIG. 6B. One option to form first conductive portion 212a having this shape is to slit or cut conductive layer 210 along pattern 211 or to form narrow pattern openings 230a and 230b along pattern 211 as, for example, shown in FIG. 6C. An undesirable portion (shown as third portion 212c) of conductive layer 210 then has to be removed to form stack 200. This undesirable portion is separated from first conductive portion 212a by the pattern openings 230a and 230b.

Peeling is one option for the removal of these undesirable portions, particularly in a roll-to-roll processing format. A process in which some or all of the undesirable portions may be removed via peeling has the advantage of allowing the undesired conductive foil to be recycled directly as scrap, without requiring an expensive chemical recovery process. However, some features of pattern 211 may present challenges during peeling. In this example, first conductive portion 212a has tab 212a', extending in the peeling direction (left-to-right). Tab 212a' partially surrounds the extension of 212c' of third portion 212c (the undesirable portion), which has to be removed. However, extension 212c' protrudes in the direction opposite of the peeling direction. The left-most edge of extension 212c' may have to be picked up during peeling to ensure that extension 212c' is not ripped from the rest of third portion 212c.

To avoid this issue, extension 212c', which may also be referred to as a "pocket" feature, can be completely removed prior to peeling, for example, as shown in FIGS. 6D and 6E.

Furthermore, an example in FIG. 6E is tailored for left-to-right peeling, such that no edges of third portion 212c (the undesirable portion) have sharp or even perpendicular angles relative to the peeling direction, to avoid tearing of third portion 212c. Another example is shown in FIG. 6F, addressing both leading and lagging edges of third portion 212c (the undesirable portion).

Returning to FIG. 1, if device stack 200 comprises some undesirable portions of conductive layer 210 after patterning operation 120, there are multiple points within method 100 at which undesirable portions of conductive layer 210 may be removed via optional operation 140. For example, as shown in FIG. 1, operation 140 may be performed prior to laminating the permanent insulator to conductive layer 210 (operation 160). Operation 140 may be also performed while removing substrate 220 (operation 170). In other words, the undesirable portions of conductive layer 210 may be removed together with substrate 220. As such, operation 140 may be a part of operation 170. Alternatively, removing these undesirable portions of conductive layer 210 during operation 140 may be performed after removing substrate (operation 170). It should be noted that these removal options may also be combined. In some embodiments, removing the undesirable portions of conductive layer 210 during operation 140 may involve peeling these portions (e.g., from substrate 220 or first insulator 240).

Method 100 may proceed with laminating first insulator 240 to first side 211a of conductive layer 210 during operation 160 (shown as a block in FIG. 1). Operation 160 may comprise one or more lamination techniques including, but not limited to, rolling, vacuum lamination, in-line lamination, roll-to-roll lamination, clamshell lamination, press lamination, and/or sheet-to-sheet lamination. In some embodiments, a combination of pressure and heat may be used to laminate first insulator 240 to first side 211a of conductive layer 210.

Figure 8A:
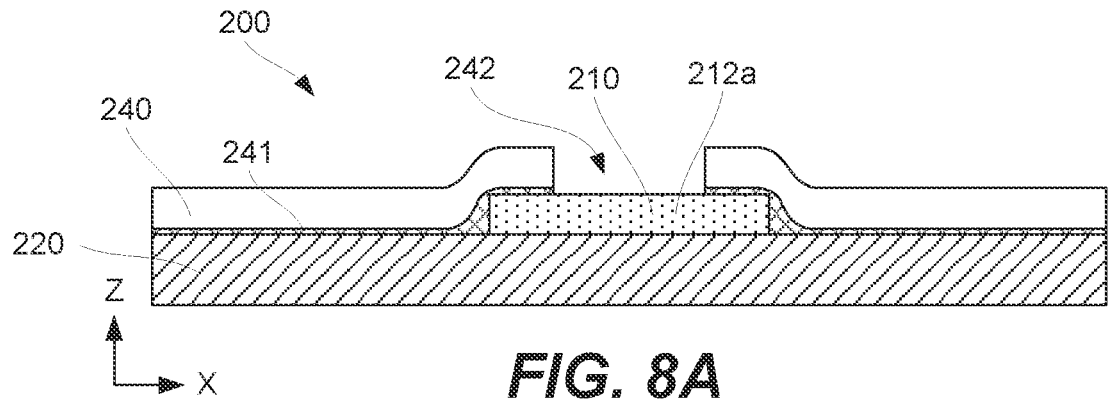
FIG. 8A illustrates an example of the device stack comprising the patterned conductive layer, substrate, and one permanent insulator, in accordance with some embodiments.
Figure 8B:
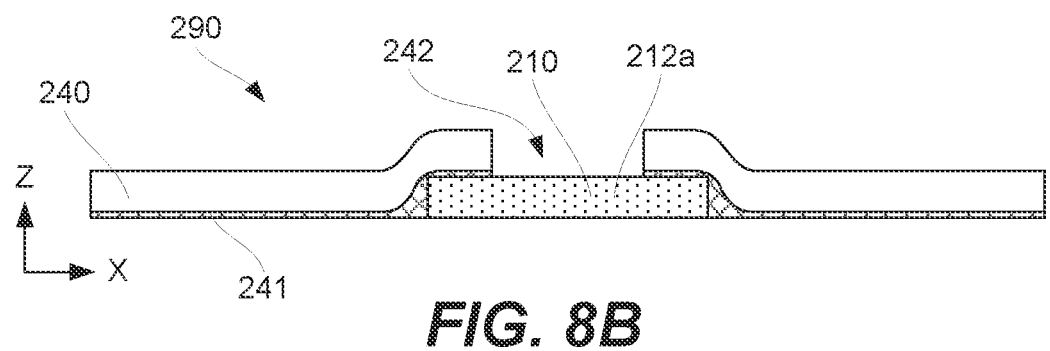
FIG. 8B illustrates an example of the interconnect circuit comprising the patterned conductive layer and one permanent insulator, in accordance with some embodiments.

FIG. 8A is a schematic illustration of device stack 200 formed during lamination operation 160. It should be noted that second side 211b (needs labeling) of conductive layer 210 remains laminated to substrate 220 during this operation. After completing operation 160, first insulator 240 may be relied on to support first conductive portion 212a and second conductive portion 212b of conductive layer 210 relative to each other. As such, after operation 160, substrate 220 may be removed.

Some examples of first insulator 240 (or second insulator 250) include, but are not limited to, polyimide (PI), polyethylene naphthalate (PEN), polyethylene terephthalate (PET), polymethyl methacrylate (PMMA), ethyl vinyl acetate (EVA), polyethylene (PE), polypropylene (PP), polyvinyl fluoride (PVF), polyamide (PA), soldermask, and polyvinyl butyral (PVB), cloth, paper, glass, foam, or any other electrically insulating material. Importantly, first insulator 240 need not be resistant to chemical etching. Furthermore, as an alternative to insulator 240 comprising free-standing layers or sheets, insulator 240 may initially be applied as a coated or printed material, and then subsequently cured using heat, UV activation, or the like. The composition and thickness of first insulator 240 may optionally be chosen to maximize heat dissipation through first insulator 240, prevent dielectric breakdown to the surrounding environment, act as a sufficient mechanical barrier to air and moisture, and/or minimize distortion of features of conductor leads. The thickness of first insulator 240 may be between 1 micrometer and 500 micrometers or, more specifically, between 10 micrometers and 125 micrometers.

First insulator 240 may comprise insulator adhesive 241, which may be activated through a combination of heat, UV light, and/or pressure.

First insulator 240 may further comprise opening 242 as, for example, shown in FIG. 8A. More specifically, opening 242 may be patterned in first insulator 240 prior to operation 160 (laminating first insulator 240 to conductive layer 210), as shown as operation 150 in FIG. 1, or opening 242 may be patterned in first insulator 240 after operation 160, also shown as operation 150 in FIG. 1.

Opening 242 may be aligned with various portions of conductive layer 210. In some embodiments, opening 242 at least partially overlaps with first conductive portion 212a of conductive layer 210 as, for example, shown in FIG. 8A. As such, first side 211a of first conductive portion 212a may remain at least partially exposed after laminating to first insulator 240. In these embodiments, opening 242 may be used to form electrical connections to conductive layer 210. As shown in FIG. 8A, a portion of first insulator 240 (e.g., the edges of first insulator 240 forming opening 242) may be laminated to first side 211a of first conductive portion 212a (e.g., around opening 242). Likewise, edges of first conductive portion 212a may be laminated to and supported by first insulator 240 as, for example, shown in FIG. 8A.

Returning to FIG. 1, method 100 may proceed with removing substrate 220 from conductive layer 210 during operation 170 (shown as a block in FIG. 1). During and after operation 170, first conductive portion 212a and second conductive portion 212b of conductive layer 210 are supported relative to each other by first insulator 240, thereby allowing the removal of substrate 220 while maintaining the relative orientation of first conductive portion 212a and second conductive portion 212b. For example, operation 170 may involve peeling substrate 220.

In some embodiments, substrate 220 comprises adhesive layer 221 contacting second side 211b of conductive layer 210. Adhesive layer 221 may be selectively de-activatable using, for example, UV radiation, IR radiation, or heat during optional operation 130 (shown as a block in FIG. 1). Operation 130 may be performed at any time after patterning conductive layer 210 (operation 120) and removing substrate 220 (operation 150). More specifically, operation 130 may be performed before or after removing the undesirable portions of conductive layer 210 (operation 140) and/or before or after laminating first insulator 240 (operation 160).

Operation 130 may be performed to reduce the adhesion between substrate 220 and any retained portions of conductive layer 210 (e.g., first conductive portion 212a and second conductive portion 212b). The adhesion between substrate 220 and any undesirable portions of conductive layer 210 (e.g., third portion 212c) may be kept the same or increased during this operation. These changes in adhesion may assist with the removal of substrate 220 and, if present, the undesirable portions of conductive layer 210 without disturbing the retained portions of conductive layer 210.

Figure 8C:
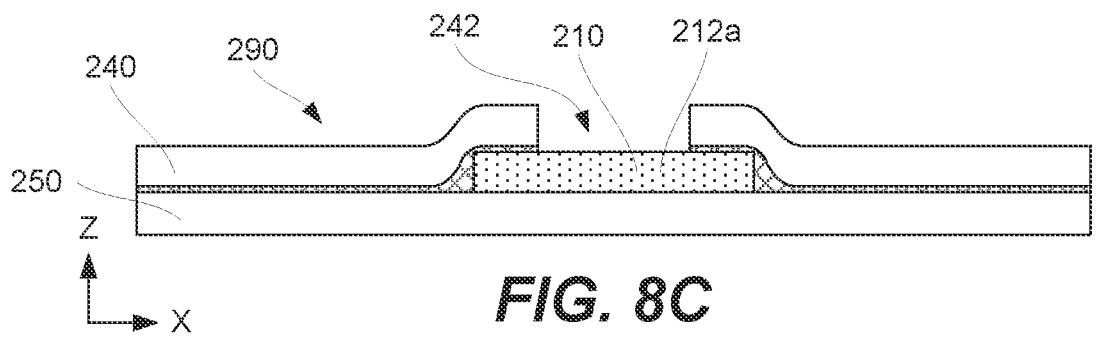
FIGS. 8C and 8D illustrate examples of the interconnect circuit comprising the patterned conductive layer and two permanent insulators, in accordance with some embodiments.

Returning to FIG. 1, method 100 may involve laminating second insulator 250 to conductive layer 210 during optional operation 190 (shown as a block in FIG. 1). FIG. 8C illustrates an example of interconnect circuit 290 having first insulator 240 and second insulator 250. Second insulator 250 may be laminated such that conductive layer 210 is disposed between first insulator 240 and second insulator 250. Second insulator 250 may comprise a second insulator adhesive, which may be activated through a combination of heat, UV light, and/or pressure Second insulator 250 (or first insulator 240) may be or may comprise a thermally conductive mounting adhesive.

This adhesive may have a thermal conductivity of least about 0.2 W/mK (e.g., about 0.7 W/mK) or even at least about 1.0 W/mK. This level of thermal conductivity may be obtained in an inorganic particle-filled dielectric film or a thermally conductive pressure-sensitive adhesive (PSA) film, for example. Insulator adhesive 241 may be positioned on one or both sides of first insulator 240. In some embodiments, insulator adhesive 241 may be applied to conductive layer 210 separately from the first insulator 240 as a freestanding film or as a coating. Some examples of insulator adhesive 241 include, but are not limited to, polyolefin adhesives, polyester adhesives, polyimide adhesives, acrylics, epoxies, cross-linking adhesives, PSAs, and/or thermoplastic adhesives. Optionally, insulator adhesive 241 may be filled with thermally conductive, electrically insulating particles (e.g., alumina) to facilitate heat transfer through the adhesive material.

Figure 8D:
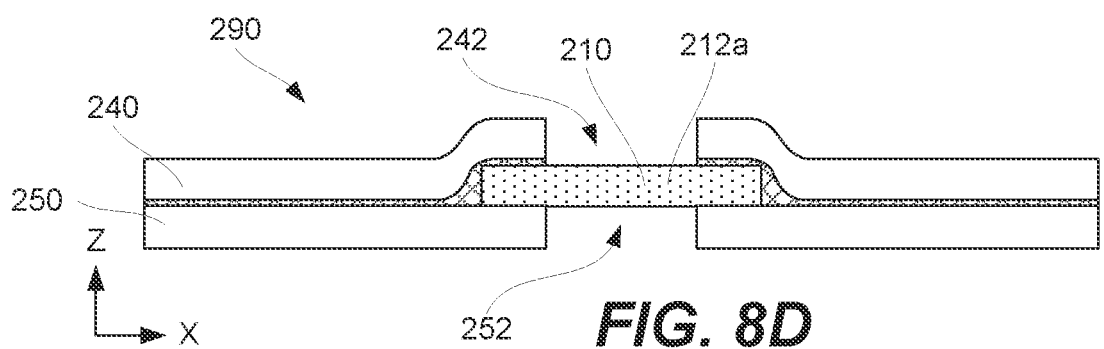

Similar to first insulator 240, second insulator 250 may be patterned with openings 252 prior to or after its lamination to conductive layer 210, as shown during optional operation 185 in FIG. 1. FIG. 8D illustrates an example of interconnect circuit 290 in which first insulator 240 has opening 242, while second insulator 250 has opening 252. Opening 252 in second insulator 250 may be aligned relative to first conductive portion 212a of conductive layer 210. In some embodiments, opening 252 in second insulator 250 may coincide with opening 242 in first insulator 240 as, for example, shown in FIG. 8D. This feature allows accessing conductive layer 210 from both sides at the same location, e.g., for processing, forming connections, and the like.

One or both of first insulator 240 and second insulator 250 may be designed for adhesively bonding to heat sinks (e.g., thermal mass, heat removal/managing devices, and the like) or other surfaces.

Figure 7C:
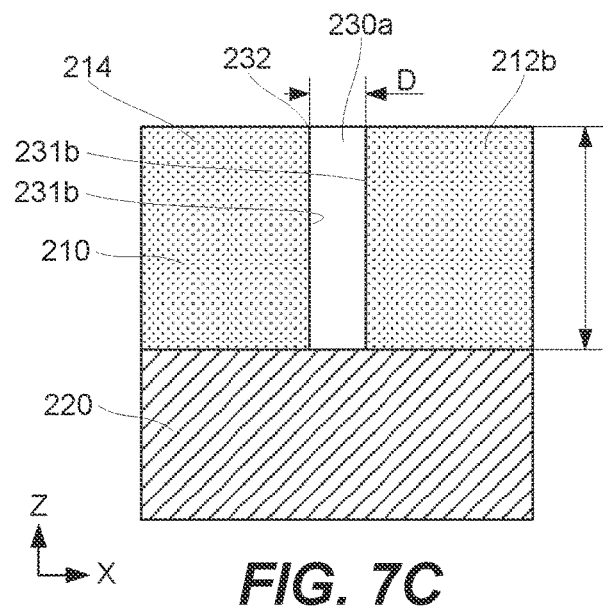
Figure 9A:
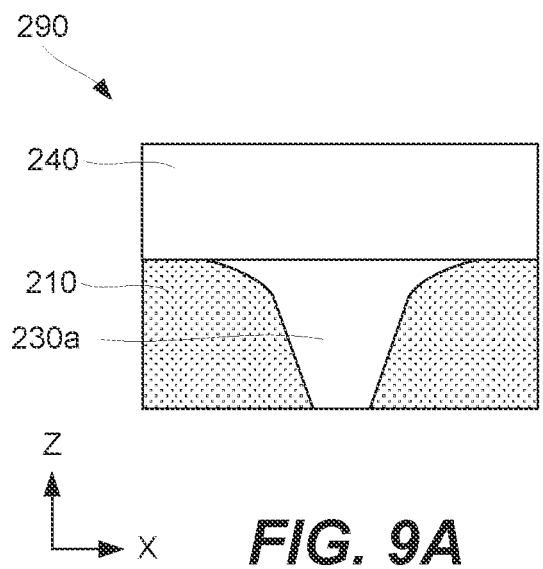
FIGS. 9A, 9B, and 9C illustrate schematic cross-sectional views of different examples of the pattern opening formed in the conductive layer laminated to the two permanent insulators, in accordance with some embodiments.
Figure 9B:
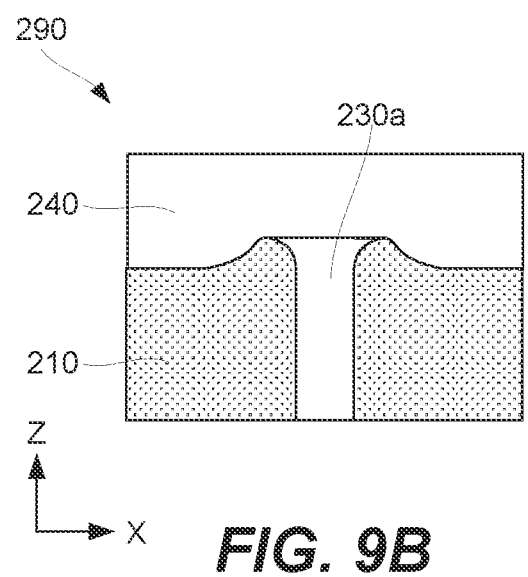
Figure 9C:
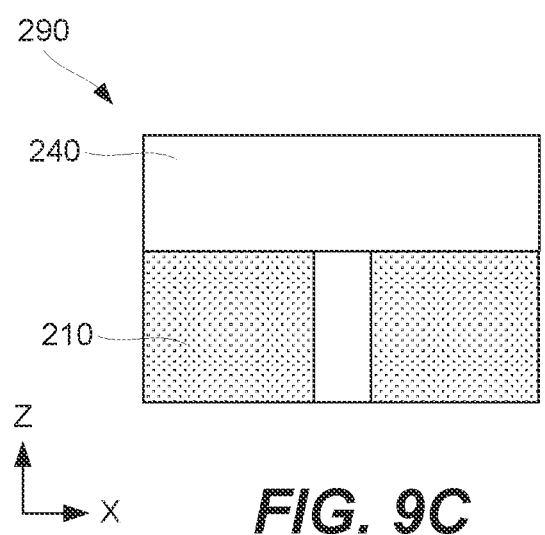

FIGS. 9A, 9B, and 9C illustrate cross-sectional partial views of interconnect circuit 290 showing different examples of pattern opening 230a formed in conductive layer 210, in accordance with some embodiments. These examples of pattern opening 230a are the same as shown in FIGS. 7A-7C and described above with reference to these figures. However, FIGS. 9A, 9B, and 9C also illustrate first insulator 240 to illustrate how different features of pattern opening 230a help or interfere with the adhesion of conductive layer 210 to first insulator 240.

FIGS. 10A-10E illustrate schematic cross-sectional views of different stages during fabrication of multilayered interconnect circuit 290, in accordance with some embodiments. As shown in FIGS. 10D and 10E, interconnect circuit 290 comprises first conductive portion 212a and second conductive portion 212b, stacked along the thickness of interconnect circuit 290 (the Z direction) with each other. While only two conductive portions are shown in these figures, one having ordinary skill in the art would understand that any number of conductive portions may be stacked along the thickness. Furthermore, each conductive portion may have one or more corresponding conductive portions, offset along the width (the X direction) of interconnect circuit 290 as, for example, shown in FIGS. 5A and 5B and described above. For differentiating reasons and without implying any spatial orientation of interconnect circuit 290, stacking along the thickness of interconnect circuit 290 (the Z direction) may be referred to as vertical stacking, while offsetting along the width of interconnect circuit 290 (the X direction) may be referred to as horizontal stacking. These types of stacking may be used for various purposes, such as forming electromagnetic shields in interconnect circuit 290, maintaining the relative orientation of conductive portions while routing interconnect circuit 290, and the like.

Examples of interconnect circuit 290 in FIGS. 10D and 10E may be formed using two device stacks, e.g., first device stack 200a, shown in FIG. 10A, and second device stack 200b, shown in FIG. 10B. Various methods of forming such device stacks are described above. First device stack 200a comprises first substrate 220a, first conductive portion 212a, and first insulator 240, which also comprises first insulator adhesive 241. Second device stack 200b comprises second substrate 220b, second conductive portion 212b, and second insulator adhesive 243, which is also operable as an insulator. As shown in FIG. 10C, third device stack 200c is formed using first device stack 200a and second device stack 200b by removing first substrate 220a and adhering second insulator adhesive 243 to first conductive portion 212a and a portion of first insulator 240. Second substrate 220b is still a part of third device stack 200c. Furthermore, first conductive portion 212a and second conductive portion 212b may be unconnected. Gap 213 may be present between first conductive portion 212a and second conductive portion 212b. Gap 213 may be formed by an opening in second insulator adhesive 243 as, for example, shown in FIG. 10B. In some embodiments, first conductive portion 212a and second conductive portion 212b may remain unconnected in final interconnect circuit 290. In these embodiments, first conductive portion 212a and second conductive portion 212b may be separated by an insulator.

Referring to FIGS. 10A-10C, first device stack 200a, second device stack 200b, and third device stack 200c are examples of intermediate structures used to form interconnect circuit 290. As shown in FIG. 10D, interconnect circuit 290 is then formed from third device stack 200c by connecting first conductive portion 212a and second conductive portion 212b within gap 213. Specifically, one or both of first conductive portion 212a and second conductive portion 212b may be pushed into gap 213 to form this connection. Various forms of electrical connections may be used, e.g., welding, soldering, crimping, and the like. Interconnect circuit 290 in FIG. 10D may be in its final form (i.e., fully fabricated form). Second substrate 220b is a part of interconnect circuit 290 in this example. Alternatively, as shown in FIG. 10E, second substrate 220b may be removed and replaced by second insulator 250 to form interconnect circuit 290. Removing second substrate 220b and laminating second insulator 250 to second conductive portion 212b and a portion of second insulator adhesive 243 may be performed before or after interconnecting first conductive portion 212a and second conductive portion 212b. For example, an opening in second insulator 250 may be used to access second conductive portion 212b while forming this connection.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

The invention claimed is:

1. A method of forming a flexible interconnect circuit, the method comprising:
   laminating a substrate to a conductive layer, wherein:
      the conductive layer comprises a first side and a second side, opposite of the first side, and the substrate is laminated to the second side of the conductive layer;

patterning the conductive layer using one or more of laser cutting and laser ablation while the conductive layer remains laminated to the substrate, wherein:

patterning the conductive layer forms a first conductive portion and a second conductive portion of the conductive layer, at least partially separated from the first conductive portion, patterning the conductive layer further forms a third conductive portion of the conductive layer, separated by a first pattern opening from the first conductive portion and also separated by a second pattern opening from the second conductive portion, patterning the conductive layer comprises removing the third conductive portion from the substrate thereby forming a pattern opening in place of the first pattern opening, the third conductive portion, and the second pattern opening, and the substrate maintains orientation of the first conductive portion relative to the second conductive portion during and after patterning;

laminating a first insulator to the first side of the conductive layer while the conductive layer remains laminated to the substrate;

removing the substrate from the conductive layer, wherein the first insulator maintains the orientation of the first conductive portion relative to the second conductive portion while and after the substrate is removed; and laminating a second insulator to the second side of the conductive layer while the first insulator remains laminated to the first side of the conductive layer, wherein:

the first insulator comprises a first-insulator opening prior to laminating the first insulator to the first side of the conductive layer, the second insulator comprises a second-insulator opening prior to laminating the second insulator to the second side of the conductive layer, and the first-insulator opening and the second-insulator opening coincide with each other and are aligned relative to the first conductive portion of the conductive layer thereby allowing access to the first conductive portion of the conductive layer from each of the first side and the second side.

2. The method of claim 1, wherein patterning the conductive layer at least partially damages the substrate such that the substrate is able to maintain the orientation of the first conductive portion relative to the second conductive portion during and after patterning.

3. The method of claim 1, wherein:

the pattern opening in the conductive layer is defined by sidewalls of the first conductive portion and the second conductive portion, extending to the substrate, and the sidewalls are tapered such that the pattern opening is smaller at an interface with the substrate than away from the substrate.

4. The method of claim 3, wherein the sidewalls have a smooth transition to the first side of the conductive layer.

5. The method of claim 1, wherein the third conductive portion of the conductive layer is removed from the substrate prior to laminating the first insulator to the first side of the conductive layer.

6. The method of claim 1, wherein the third conductive portion of the conductive layer is removed from the first insulator after the substrate has been removed from the conductive layer.

7. The method of claim 1, wherein the third conductive portion is removed while removing the substrate from the conductive layer.

8. The method of claim 1, wherein:

at least one of the first insulator and the second insulator comprises a thermally conductive mounting adhesive having a thermal conductivity of least about 0.2 W/mK, and the thermally conductive mounting adhesive overlaps with the first conductive portion and bonds the first insulator and the second insulator.

9. The method of claim 8, wherein the thermally conductive mounting adhesive is one of an inorganic particle-filled dielectric film or a thermally conductive pressure- sensitive adhesive (PSA) film.

10. The method of claim 1, wherein the conductive layer comprises aluminum.

11. The method of claim 1, wherein the conductive layer has a uniform composition throughout a thickness of the conductive layer.

12. The method of claim 1, wherein the conductive layer is a rolled metal foil.

13. The method of claim 1, wherein, after laminating the first insulator to the first side of the conductive layer, the first insulator extends across the pattern opening in the conductive layer.

14. The method of claim 1, wherein the first insulator comprises an insulator adhesive, contacting the first side of the conductive layer and comprising one of a polyolefin adhesive, a polyester adhesive, a polyimide adhesive, an acrylic, an epoxy, a cross-linking adhesive, a pressure-sensitive adhesive, and a thermoplastic adhesive.

15. The method of claim 14, wherein the insulator adhesive further comprises thermally conductive, electrically insulating particles.

16. The method of claim 1, wherein one or both of the first insulator and the second insulator are configured to adhesively bond to an external component.

17. The method of claim 1, further comprising stacking an additional conductive portion over the first conductive portion along a thickness of the flexible interconnect circuit, wherein the additional conductive portion and the first conductive portion are interconnected.

18. The method of claim 17, wherein the second insulator is laminated to the conductive layer through the additional conductive portion.

19. The method of claim 1, wherein the conductive layer comprises copper.

20. The method of claim 1, wherein at least one of the first insulator and the second insulator comprises a material selected from the group consisting of polyimide (PI), polyethylene terephthalate (PET), and polyethylene naphthalate (PEN).

21. A method of forming an interconnect circuit, the method comprising:

laminating a substrate to a conductive layer, wherein:

the conductive layer comprises a first side and a second side, opposite of the first side, and the substrate is laminated to the second side of the conductive layer;

patterning the conductive layer using one or more of laser cutting and laser ablation while the conductive layer remains laminated to the substrate, wherein:

patterning the conductive layer forms a first conductive portion and a second conductive portion of the conductive layer, at least partially separated from the first conductive portion, and the substrate maintains orientation of the first conductive portion relative to the second conductive portion during and after patterning;

laminating a first insulator to the first side of the conductive layer while the conductive layer remains laminated to the substrate, wherein the first insulator comprises an insulator adhesive, contacting the first side of the conductive layer and comprising one of a polyolefin adhesive, a polyester adhesive, a polyimide adhesive, an acrylic, an epoxy, a cross-linking adhesive, a pressure-sensitive adhesive, and a thermoplastic adhesive;

removing the substrate from the conductive layer, wherein the first insulator maintains the orientation of the first conductive portion relative to the second conductive portion while and after the substrate is removed; and laminating a second insulator to the second side of the conductive layer while the first insulator remains laminated to the conductive layer , wherein:
- the first insulator comprises a first-insulator opening prior to laminating the first insulator to the first side of the conductive layer,
- the second insulator comprises a second-insulator opening prior to laminating the second insulator to the second side of the conductive layer, and
- the first-insulator opening and the second-insulator opening coincide with each other and are aligned relative to the first conductive portion of the conductive layer thereby allowing access to the first conductive portion of the conductive layer from each of the first side and the second side.

22. The method of claim 1, wherein the conductive layer has a thickness of between 50 micrometers and 500 micrometers.

23. A method of forming a flexible interconnect circuit, the method comprising:

laminating a substrate to a conductive layer, wherein:
- the conductive layer comprises a first side and a second side, opposite of the first side, and
- the substrate is laminated to the second side of the conductive layer;

patterning the conductive layer using one or more of laser cutting and laser ablation while the conductive layer remains laminated to the substrate, wherein:
- patterning the conductive layer forms a first conductive portion and a second conductive portion of the conductive layer, at least partially separated from the first conductive portion, and
- patterning the conductive layer at least partially damages the substrate such that the substrate maintains orientation of the first conductive portion relative to the second conductive portion during and after patterning;

laminating a first insulator to the first side of the conductive layer while the conductive layer remains laminated to the substrate;

removing the substrate from the conductive layer, wherein the first insulator maintains the orientation of the first conductive portion relative to the second conductive portion while and after the substrate is removed; and laminating a second insulator to the second side of the conductive layer while the first insulator remains laminated to the conductive layer, wherein:
- the first insulator comprises a first-insulator opening prior to laminating the first insulator to the first side of the conductive layer,
- the second insulator comprises a second-insulator opening prior to laminating the second insulator to the second side of the conductive layer, and
- the first-insulator opening and the second-insulator opening coincide with each other and are aligned relative to the first conductive portion of the conductive layer thereby allowing access to the first conductive portion of the conductive layer from each of the first side and the second side.

24. The method of claim 21, wherein the insulator adhesive of the first insulator comprises the pressure-sensitive adhesive.

* * * * *